United States Patent [19]
Haruki

[11] Patent Number: 5,867,401
[45] Date of Patent: Feb. 2, 1999

[54] PHASE SHIFTER ARRANGING METHOD AND COMPUTER READABLE MEDIUM STORING PROGRAM FOR CARRYING OUT THE METHOD

[75] Inventor: Tamae Haruki, Kawasaki, Japan

[73] Assignee: Fujitsu Limited, Kawasaki, Japan

[21] Appl. No.: 758,861

[22] Filed: Dec. 2, 1996

[30] Foreign Application Priority Data

Jan. 11, 1996 [JP] Japan .................................. 8-003428

[51] Int. Cl.$^6$ ................................................ H01L 21/308
[52] U.S. Cl. ...................... 364/490; 364/491; 364/578; 395/183.22; 395/309
[58] Field of Search ................................... 364/525, 490, 364/491, 551.01, 270, 488–489, 578, 512; 430/5; 395/309, 559, 183.22, 878

[56] References Cited

U.S. PATENT DOCUMENTS

| | | | |
|---|---|---|---|
| 5,441,834 | 8/1995 | Takekuma et al. | 430/5 |
| 5,465,220 | 11/1995 | Haruki et al. | 347/256 |
| 5,537,648 | 7/1996 | Liebmann et al. | 364/489 |
| 5,592,633 | 1/1997 | Casis et al. | 395/309 |
| 5,636,131 | 6/1997 | Liebmann et al. | 364/490 |
| 5,680,588 | 10/1997 | Gortych et al. | 395/500 |

OTHER PUBLICATIONS

Akemi Moniwa et al.; Heuristic Method for Phase–Conflict Minimization in Automatic Phase–Shift Mask Design; Jpn. J. Appl. Phys. vol. 34, Part 1, No.12B; pp. 6584–6589; Dec. 1995.

*Primary Examiner*—James P. Trammell
*Assistant Examiner*—Cuong H. Nguyen
*Attorney, Agent, or Firm*—Armstrong, Westerman, Hattori, McLeland, & Naughton

[57] ABSTRACT

A phase shifter arranging method selectively arranges phase shifters on aperture patterns of a photomask so that a phase difference of πradians occurs between lights transmitted through mutually adjacent aperture patterns of the photomask. The phase shifter arranging method is computer-implemented and comprises the steps of (a) extracting connections of nodes via branch as a net, where each aperture pattern is taken as a node, and mutually adjacent aperture patterns having an interval less than or equal to a predetermined value D0 are taken as nodes connected via a branch, (b) dividing the net into an open net and a closed net which are independent of each other, where the open net has no closed loop and the closed loop is other of the open loop, and (c) selectively arranging the phase shifters with respect to each of mutually independent closed nets.

28 Claims, 22 Drawing Sheets

| | A(11) | A(13) | A(14) | A(15) | A(16) | A(18) | A(19) | A(20) | A(21) | A(22) | A(23) |
|---|---|---|---|---|---|---|---|---|---|---|---|
| x1 | 13 | 20 | 20 | 14 | 15 | 0 | 18 | 21 | 18 | 14 | 22 |

FIG. 9A

| | A(11) | A(13) | A(14) | A(15) | A(16) | A(18) | A(19) | A(20) | A(21) | A(22) | A(23) |
|---|---|---|---|---|---|---|---|---|---|---|---|
| x2 | 13 | 19 | 20 | 14 | 15 | 0 | 18 | 21 | 18 | 14 | 22 |

FIG. 9B

| | A(11) | A(13) | A(14) | A(15) | A(16) | A(18) | A(19) | A(20) | A(21) | A(22) | A(23) |
|---|---|---|---|---|---|---|---|---|---|---|---|
| x3 | 13 | 20 | 20 | 14 | 15 | 0 | 13 | 21 | 18 | 14 | 22 |

FIG. 9C

PHASE SHIFTER ARRANGING METHOD AND COMPUTER READABLE MEDIUM STORING PROGRAM FOR CARRYING OUT THE METHOD

BACKGROUND OF THE INVENTION

The present invention generally relates to phase shifter arranging methods and computer program products, and more particularly to a phase shifter arranging method for arranging phase shifters with respect to a photomask, and to a computer program product which stores a program for carrying out the phase shifter arranging method.

Recently, patterns of semiconductor integrated circuits have become smaller, and there are demands to improve the focal depth and the resolution of the exposure.

An amplitude of monochromatic light transmitted through aperture patterns 2 and 4 of a photomask 1 shown in FIG.1A and an amplitude of monochromatic light transmitted through aperture patterns 3 and 5 of the photomask 1 respectively become as indicated by ø1 and ø2 on a semi-conductor waver, as shown in FIG.1B. In the case, a light intensity becomes proportional to $|ø1+ø2|^2$ as shown in FIG.1C. The lights transmitted through the aperture patterns 2 through 5 are diffracted, and interfere so as to intensify each other between the adjacent exposure patterns, thereby causing the resolution of the exposure to deteriorate. This problem of deteriorating resolution of exposure becomes more conspicuous as the patterns become smaller.

Hence, as shown in FIG.1D, there is a technique to eliminate the above described problem by arranging phase shifters (or phase shift layers) 6 and 7 over the corresponding aperture patterns 3 and 5 of a photomask 1A. In this case, the lights transmitted through adjacent aperture patterns have a phase difference of πradians, so that the transmitted lights interfere so as to weaken each other. The monochromatic light transmitted through the aperture patterns 3 and 5 has an amplitude $-ø2$ shown in FIG.1E. In addition, the light intensity becomes proportional to $|ø1-ø2|^2$ as shown in FIG.1F. Hence, the resolution of the exposure is improved and the focal depth is also improved by the provision of the phase shifters 6 and 7.

A large number of aperture patterns are arranged two-dimensionally on the photomask. In general, it is therefore impossible to arrange the phase shifter on only one of the two mutually adjacent aperture patterns with respect to all of the mutually adjacent aperture patterns. In addition, when 1000 aperture patterns exist, for example, there are 2999 different ways to arrange the phase shifters, and it is difficult even by use of a computer to find an optimum solution.

Conventionally, a skilled person determined the arrangement of the phase shifters manually. As a result, the operation of determining the arrangement of the phase shifters was extremely complex and troublesome to carry out, thereby putting a large burden on the skilled person. In addition, it was difficult to find a desirable or optimum arrangement for the phase shifters. It is conceivable to use a computer to arrange the phase shifters at random and then optimize this random arrangement, however, there is just too many ways to arrange the phase shifters, and this conceivable method is impractical.

Therefore, it was more practical for the skilled person to manually determine the arrangement of the phase shifters.

SUMMARY OF THE INVENTION

Accordingly, it is a general object of the present invention to provide a novel and useful phase shifter arranging method and computer program product, in which the problems described above are eliminated.

Another and more specific object of the present invention is to provide a computer-implemented phase shifter arranging method which can automatically obtain a desirable or optimum arrangement of phase shifters with respect to a photomask, and a computer program product which stores a program for realizing this phase shifter arrranging method.

Still another object of the present invention is to provide a phase shifter arranging method which selectively arranges phase shifters on aperture patterns of a photomask so that a phase difference of πradians occurs between lights transmitted through mutually adjacent aperture patterns of the photomask, where the phase shifter arranging method is computer-implemented and comprises the steps of (a) extracting connections of nodes via branches as a net, where each aperture pattern is taken as a node, and mutually adjacent aperture patterns having and interval less than or equal to a predetermined value DO are taken as nodes connected via a branch, (b) dividing the net into an open net and a closed net which are independent of each other, where the open net has no closed loop and the closed loop is other than the open loop, and (c) seletively arranging the phase shifters with respect to each of mutually independent closed nets. According to the phase shifter arranging method of the present invention, the selective arrangement of the phase shifters can be optimized independently for each of the closed nets which are obtained by dividing the net. For this reason, the ways in which the phase shifters can be arranged with respect to the aperture patterns of the photomask are greatly reduced. Therefore, an optimized phase shifter arrangement can be obtained automatically and efficiently within a short time.

A further object of the present invention is to provide the phase shifter arranging method, wherein the tree is modified using a genetic algorithm which includes a crossover, and the crossover comprises the steps of selecting first and second trees of the same closed net at random based on a probability which depends on the sum total, selecting one of the nodes at random from each of the first and second trees, replacing a first sub-tree having the selected one node from the first tree as a sub-trunk node by a second sub-tree having the selected one node from the second tree as a sub-trunk node, adding nodes included in the first sub-tree and not included in the second sub-tree to the second sub-tree using a connection relationship identical to that within the first sub-tree, and deleting overlapping nodes included in the second sub-tree and in the first tree excluding the first sub-tree, except for nodes in a path from the sub-trunk node of the first treed to the trunk node via the real branches and nodes included in the second sub-tree. According to the phase shifter arranging method of the present invention, it is possible to carry out the optimization locally at a high speed. Since the good portions of the chromosomes are maintained as much as possible by the mutation and crossover, a better optimum solution is obtainable.

Another object of the present invention is to provide the phase shifter arranging method which further comprises the steps of defining a load which becomes larger as a value D becomes smaller and becomes smaller as a value L becomes larger, where D denotes an approximate interval between two adjacent aperture patterns corresponding to two nodes at both ends of the branch, and L denotes an approximate length along a contour of the aperture pattern having the approximate interval D with respect to the adjacent aperture pattern, and creating a tree as a chromosome in a first generation of the genetic algorithm, by calculating weights for all branches within the closed net, sorting the weights depending on size, and selecting the real branch with priority starting from a largest weight. According to the phase shifter arranging method of the present invention, the initial level of evolution of the chromosome becomes high in the optimization. As a result, it is easier to obtain the optimized phase shifter arrangement.

Still another object of the present invention is to provide a computer program product having a computer readable medium having computer program logic recorded thereon for selectively arranging phase shifters on aperture patterns of a photomask so that a phase difference of πradians occurs between lights transmitted through mutually adjacent aperture patterns of the photomask, comprising first means for extracting connections of nodes via branches as a net, where each aperture pattern is taken as a node, and mutually adjacent aperture patterns having an interval less than or equal to a predetermined value D0 are taken as nodes connected via a branch, second means for dividing the net into an open net and a closed net which are independent of each other, where the open net has no closed loop and the closed loop is other than the open loop, and third means for selectively arranging the phase shifters with respect to each of mutually independent closed nets. According to the computer program product of the present invention, the selective arrangement of the phase shifters can be optimized independently for each of the closed nets which are obtained by dividing the net. For this reason, the ways in which the phase shifters can be arranged with respect to the aperture patterns of the photomask are greatly reduced. Therefore, an optimized phase shifter arrangement can be obtained automatically and efficiently within a short time.

A further object of the present invention is to provide the computer program product, wherein the tree is modified using a genetic algorithm which includes a crossover, and the crossover comprises the steps of selecting first and second trees of the same closed net at random based on a probability which depends on the sum total, selecting one of the nodes at random from each of the first and second trees, replacing a first sub-tree having the selected one node from the first tree as a sub-trunk node by a second sub-tree having the selected one node from the second tree as a sub-trunk node, adding nodes included in the first sub-tree and not included in the second sub-tree to the second sub-tree using a connection relationship identical to that within the first sub-tree, and deleting overlapping nodes included in the second sub-tree and in the first tree excluding the first sub-tree, except for nodes in a path from the sub-trunk node of the first tree to the trunk node via the real branches and nodes included in the second sub-tree. According to the computer program product of the present invention, it is possible to carry out the optimization locally at a high speed. Since the good portions of the chromosomes are maintained as much as possible by the mutation and crossover, a better optimum solution is obtainable.

Another object of the present invention is to provide the computer program product which further comprises means for defining a load which becomes larger as a value D becomes smaller and becomes smaller as a value L becomes larger, where D denotes an approximate interval between two adjacent aperture patterns corresponding to two nodes at both ends of the branch, and L denotes an approximate length along a contour of the aperture pattern having the approximate interval D with respect to the adjacent aperture pattern, and means for creating a tree as a chromosome in a first generation of the genetic algorithm, by calculating weights for all branches within the closed net, sorting the weights depending on size, and selecting the real branch with priority starting from a largest weight. According to the computer program product of the present invention, the initial level of evolution of the chromosome becomes high in the optimization. As a result, it is easier to obtain the optimized phase shifter arrangement.

Other objects and further features of the present invention will be apparent from the following detailed description when read in conjunction with the accompanying drawings.

BRIEF DESCRIPTION OF THE DRAWINGS

FIGS.9A, 9B and 9C respectively are diagrams for explaining array representations of the trees shown in FIGS.6B, 7B and 8B;

DESCRIPTION OF THE PREFERRED EMBODIMENTS

Figure 1A:
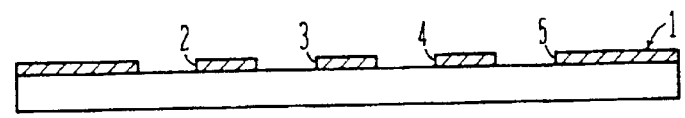
FIG.1A is a cross sectional view showing an example of a photomask.
Figure 1B:
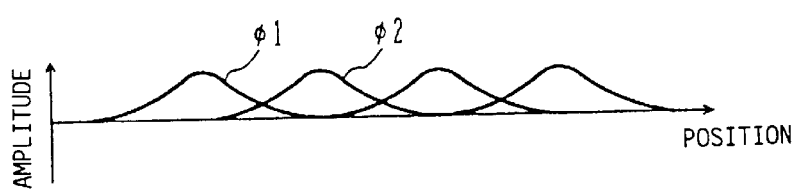
FIG.1B is a diagram showing an amplitude versus position characteristic of light transmitted through aperture patterns of the photomask shown in FIG.1A.
Figure 1C:
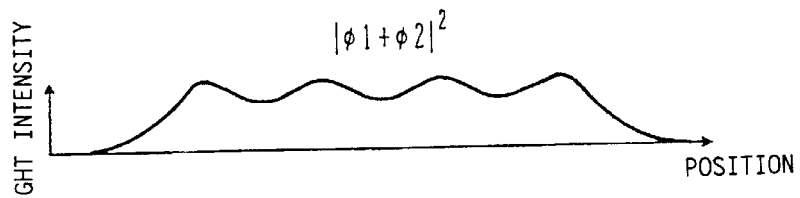
FIG.1C is a diagram showing a light intensity versus position characteristic of light exposed on a wafer using the photomask shown in FIG.1A.
Figure 1D:
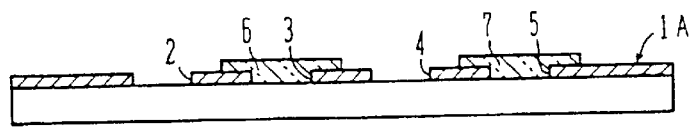
FIG.1D is a cross sectional view showing an example of a photomask having phase shifters.
Figure 1E:
FIG.1E is a diagram showing an amplitude versus position characteristic of light transmitted through aperture patterns of the photomask shown in FIG.1D.
Figure 1F:
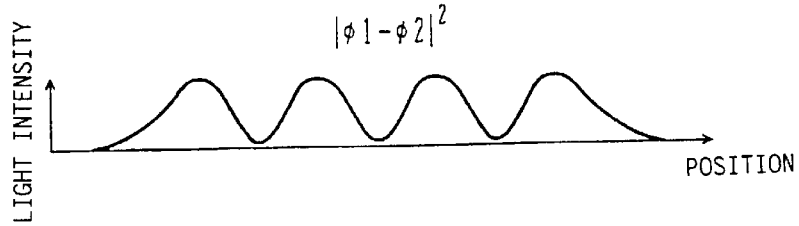
FIG.1F is a diagram showing a light intensity versus position characteristic of light exposed on a wafer using the photomask shown in FIG.1D.
Figure 2:
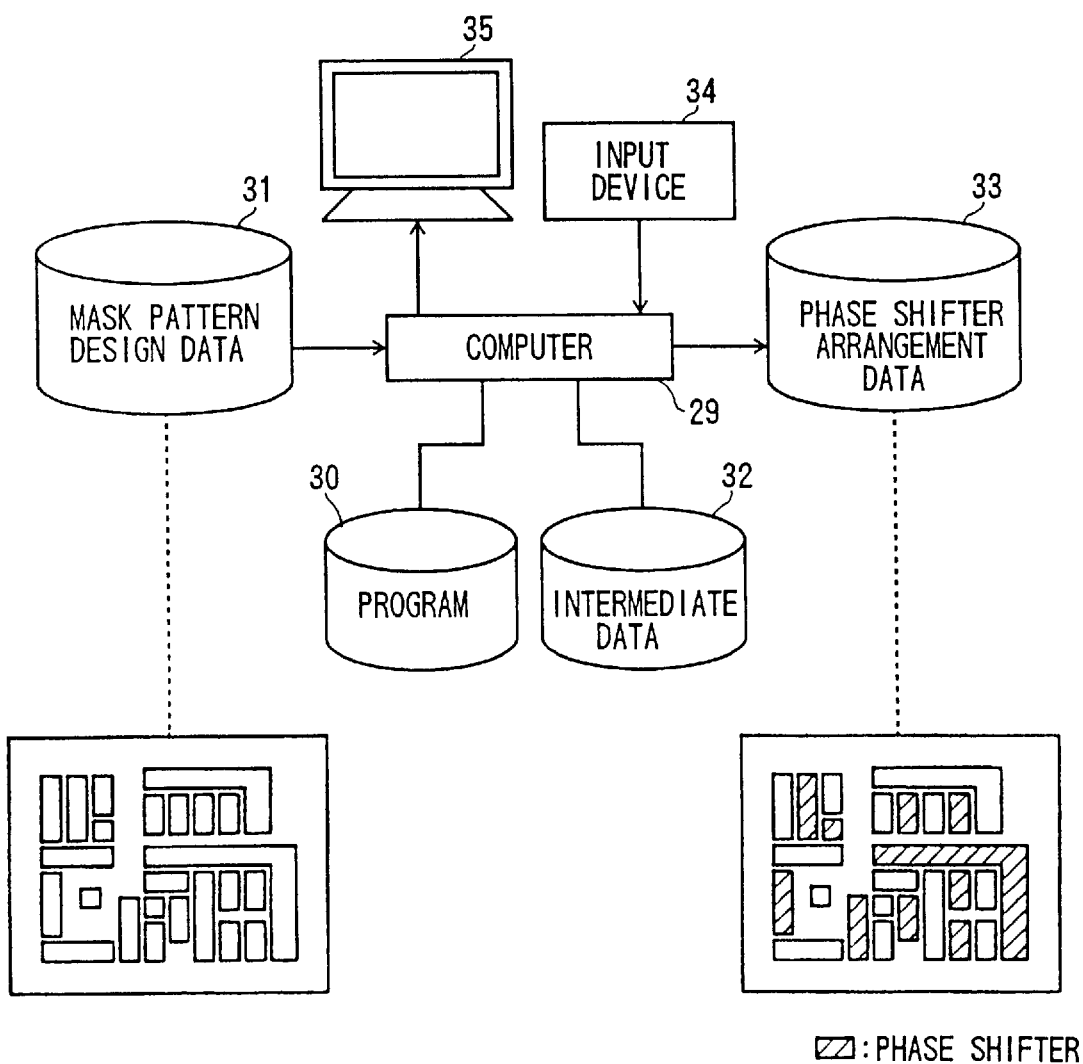
FIG.2 is a diagram showing the general construction of a computer aided design apparatus applied with the present invention.

FIG.2 shows the general construction of a computer aided design (CAD) apparatus which is applied with the present invention. More particularly, the CAD apparatus carries out a first embodiment of a phase shifter arranging method according to the present invention, so as to selectively arrange phase shifters for realizing a phase difference of $\pi$radians between lights transmitted through adjacent aperture patterns of a photomask.

The hardware of this CAD apparatus is basically the same as that of a general CAD apparatus. The CAD apparatus includes a computer 29 including a central processing unit (CPU) or a microprocessor unit (MP), storage units 30 through 33, a manual input device 34 such as a keyboard and mouse, and a display unit 35 which are connected as shown in FIG.2.

In FIG.2, storage means is divided into the storage units 30 through 33 depending on the respective functions. The storage unit 30 stores a program which is executed by the computer 29. The storage unit 31 stores mask pattern design data including polygonal data. The storage unit 32 stores intermediate data which are used during calculations before a result is obtained. The storage unit 33 stores phase shifter arrangement data corresponding to the result. In FIG.2, the phase shifters are arranged on aperture patterns indicated by the hatching.

In FIG.2, the storage means is shown as being divided into the storage units 30 through 33 depending on the respective functions, but the functions of the storage units 30 through 33 can of course be realized by one or a plurality of storage units. In addition, the storage units 30 through 33 are not limited to a specific kind or type of storage unit.

The storage unit 30 stores the program which realizes the phase shifter arranging method according to the present invention. This storage unit 30 is made up of a storage medium, that is, a computer program product, typified by disks such as floppy disks, optical disks, CD-ROMs and magneto-optic disks, ROMs, RAMs, EPROMs, EEPROMs, magnetic or optical cards and the like.

Figure 3:
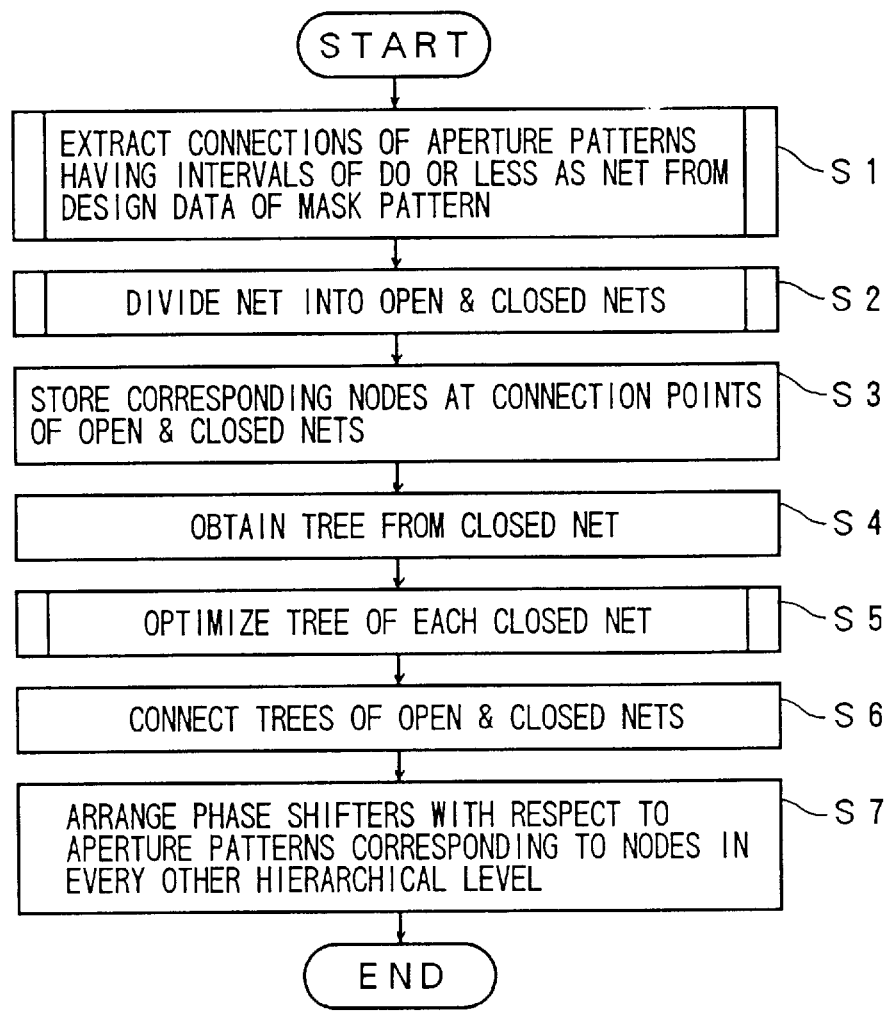
FIG.3 is a flow chart for explaining the operation of a first embodiment of a phase shifter arranging method according to the present invention.

FIG.3 is a flow chart for explaining the operation of this embodiment. The operation shown in FIG.3 is carried out by the computer 29 shown in FIG.2.

Figure 4A:
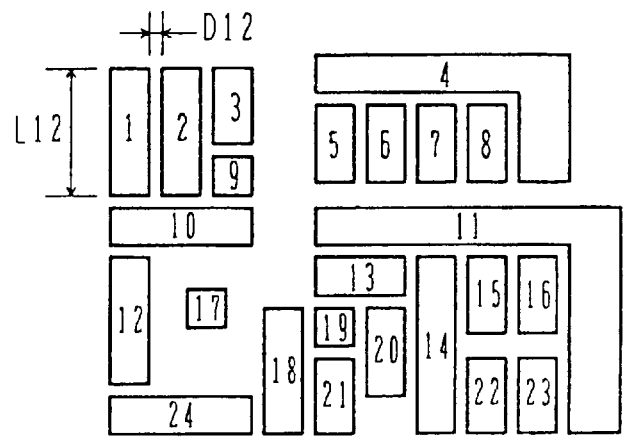
FIG.4A is a diagram showing a photomask pattern.
Figure 4B:
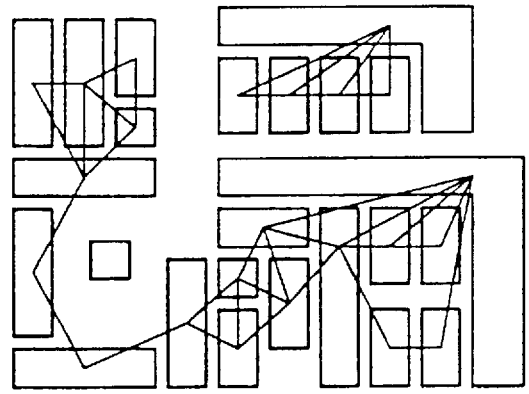
FIG.4B is a diagram showing a net which is formed with respect to the photomask pattern shown in FIG.4A.
Figure 5:
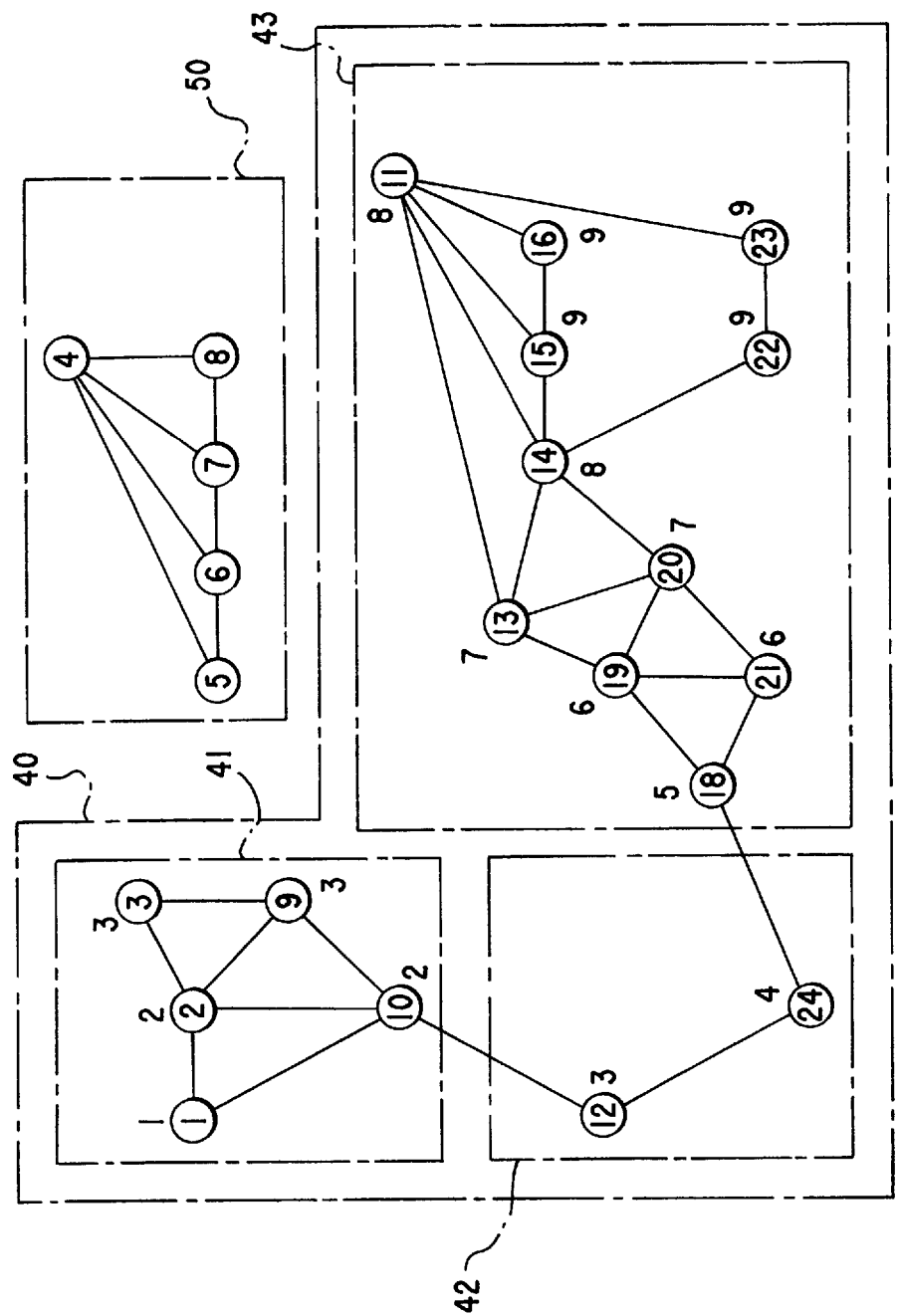
FIG.5 is a diagram showing the structure of the net shown in FIG.4B.

With respect to a photomask pattern shown in FIG.4A, a step S1 shown in FIG.3 regards aperture patterns as nodes as shown in FIG.4B. In addition, a branch is formed between two adjacent aperture patterns having a separating distance less than or equal to a predetermined value D0 therebetween. Furthermore, the step S1 extracts connections of the branches via the nodes as a net. FIG.5 shows the structure of the net shown in FIG.4B. In FIG.5, the node is indicated by a circular mark, and a node number is indicated within the circular mark. The node numbers shown in FIG.5 match the numbers assigned to the corresponding aperture patterns shown in FIG.4A.

As a result, a region having "23" aperture patterns in FIG.4A is divided into a net 40 having "18" nodes and a net 50 having "5" nodes as shown in FIG.5.

Mutually independent phase shifters can be arranged with respect to the net 40 and the net 50. For this reason, it is possible to greatly reduce the ways in which the phase shifters can be arranged, and a desirable or optimum phase shifter arrangement can be found within a short time.

Figure 7B:
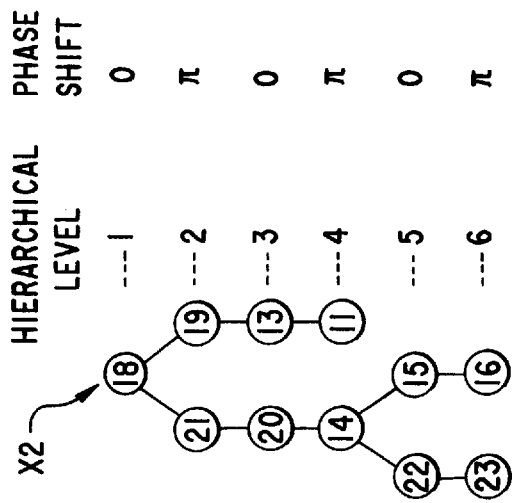
FIGS.7A and 7B respectively are diagrams for explaining the process of obtaining the tree from the closed net in the first embodiment.
Figure 7A:
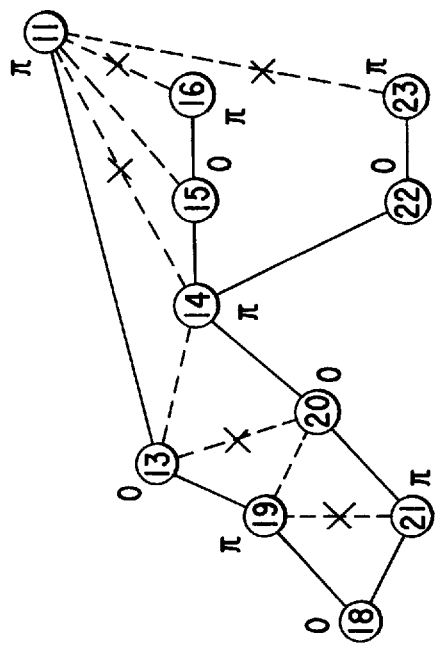

More particularly, in the case shown in FIG.7A, there are $2^{23-1}$ ways in which the phase shifters can be arranged. On the other hand, when this region having "23" aperture patterns is divided into the nets 40 and 50, there are only $(2^{18-1} + 2^{5-1})$ ways in which the phase shifters can be arranged. The "−1" in the exponential for both cases is justified, because even if an aperture pattern having no phase shifter arranged thereon and an aperture pattern having a phase shifter arranged thereon are switched, the effect of the phase shift is the same, and these two switchable combinations can be regarded as being only one combination.

A step S2 divides the net into an open net in which no loop exists, and a closed net in which a loop exists. In the case shown in FIG.5, for example, the step S2 divides the net 40 into an open net 42 in which no loop exists, and closed nets 41 and 43 other than the closed net, that is, the closed nets 41 and 43 in which at least one loop exists. No open net exists in the net 50, and this net 50 is one closed net.

The closed net can be obtained as follows. That is, a loop is searched in the net 40 by moving between the nodes via the branches, and a closed net number is assigned to each node forming the loop. The same closed net number is assigned to different closed nets having a common node. Connections of the branches via the nodes having the same closed net number assigned thereto form the closed net. On the other hand, connections of the branches via the nodes having no closed net number assigned thereto form the open net.

In the open net 42, the phase shifters are arranged for every other node corresponding to the aperture pattern, from one end to the other end of the open net 42. On the other hand, as described above, the effect of the phase shift is the same even if the aperture patterns having the phase shifters arranged thereon and the aperture patterns having no phase shifter arranged thereon are switched. For this reason, whether or not to arrange the phase shifter at the node 10 of the closed net 41 connected to the node 12 at one end of the open net 42, and at the node 18 of the closed net 43 connected to the node 24 at the other end of open net 42 is option. Accordingly, the arrangement of the phase shifters with respect to the closed net 41, the open net 42 and the closed net 43 can be determined independently of each other.

The independent net found in the step S1 is further divided into mutually independent open and closed nets in the step S2. Hence, the ways in which the phase shifters can be arranged are greatly reduced, and it becomes possible to find a desirable or optimum phase shifter arrangement within a short time.

More particularly, before the division of the net into the mutually independent open and closed nets, there are $(2^{17}+2^4)=131,088$ ways in which the phase shifters can be arranged with respect to the net 40. On the other hand, after the net is divided into the mutually independent open and closed nets, there are only $(2^4+2+2^{10})=1042$ ways in which the phase shifters can be arranged with respect to the net 40.

A step S3 shown in FIG.3 stores the node numbers of corresponding end points connecting the open net and the closed net when the net is divided in the step S2, for use in a step S6 which will be described later. For example, in the case show in FIG.5, the node number pairs 12/10 and 24/18 are stored.

Figure 6B:
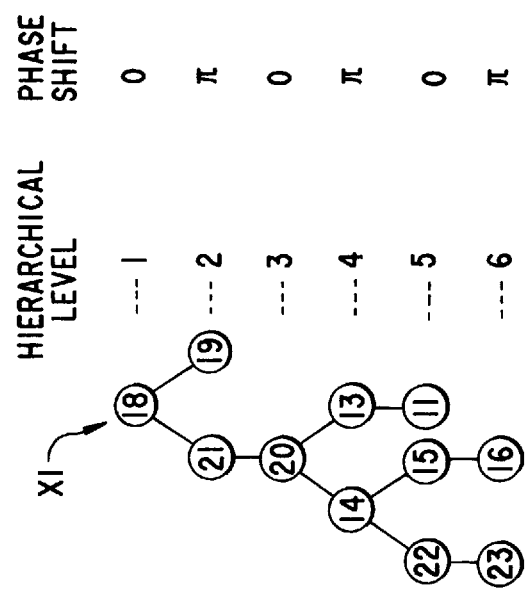
FIGS.6A and 6B respectively are diagrams for explaining a process of obtaining a tree from a closed net in the first embodiment.
Figure 6A:
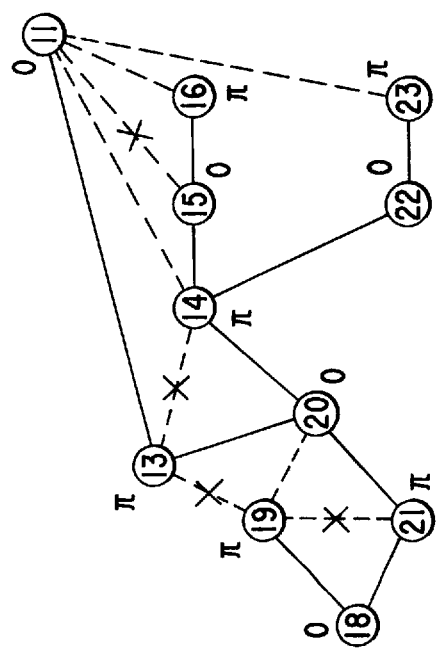

A step S4 obtains a tree from the closed net, where the tree includes all of the nodes of this closed net. For example, a portion of the branches indicated by a dotted line in FIG.6A is deleted as being void branches and the remaining branches indicated by a solid line are regarded as real branches, so that it is possible to move from an arbitrary node other than the trunk node 18 to the trunk node 18 via the real branches in a single path. In other words, FIG.6B shows the tree X1 which is obtained from the closed net 43 when the void branches are selected as shown in FIG.6A, and a hierarchical level and phase shift of each node in the tree X1 are shown on the right side of FIG.6B.

In this specification, a "real branch" refers to a branch which is selected as the branch forming the tree. On the other hand, a "void branch" refers to a branch which is not selected as the branch forming the tree.

Figure 8B:
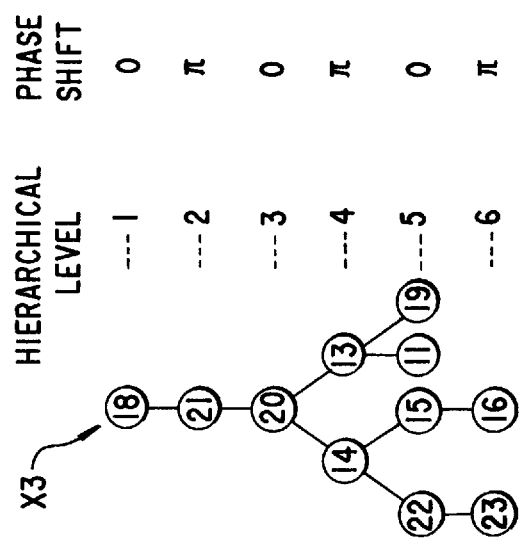
FIGS.8A and 8B respectively are diagrams for explaining the process of obtaining the tree from the closed net in the first embodiment.
Figure 8A:
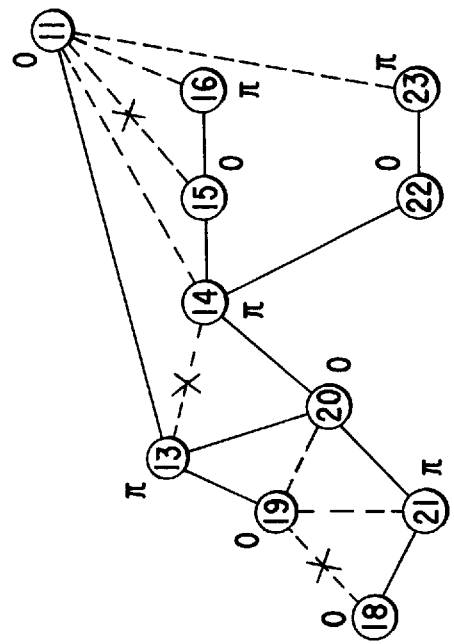

FIG.7B shows another tree X2 which is obtained from the closed net 43 when the void branches are selected as shown in FIG.7A. Similarly, FIG.8B shows still another tree X3 which is obtained from the closed net 43 when the void branches are selected as shown in FIG.8A. The hierarchical level and phase shift of each node in the trees X2 and X3 are also shown on the right side of FIGS.7B and 8B.

The tree is created in order to make one tree correspond to one phase shifter arrangement. As shown in FIG.6B, the trunk node 18 is regarded as the first hierarchical level, a node which is reached by passing through i real branches from the trunk node 18 is regarded as being in a (i+1)th hierarchical level, and the phase shifters are arranged at the nodes corresponding to every other hierarchical level. In FIGS.6B, 7B and 8B, a "0" phase shift indicates that no phase shifter is arranged at the node, and a "π" phase shift indicates that the phase shifter is arranged at the node to make a phase shift of πradians. By arranging the phase shifters in this manner, the phase difference becomes πbetween two nodes at both ends of all of the real branches, and the resolution and the focal depth are improved by reducing contradictory branches having the phase difference 0 from the void branches. In FIGS.6A, 7A and 8A, the contradictory branches are indicated by a symbol "X". The contradictory branch is a void branch between two nodes which are both in the even numbered hierarchical levels or in the odd numbered hierarchical levels.

The open net is a tree in which no void branch exists. Hence, there is only one way of arranging the phase shifters, and the tree does not need to be optimized.

A step S5 shown in FIG.3 optimizes the tree with respect to each closed net, so that a total number I of contradictory branches becomes a minimum.

If the number of nodes in the closed net is small, it is possible to consider all possible phase shifter arrangements and find an optimum solution. But in general, the number of nodes in the closed net is large, and the solution is obtained by approximation. Various approximation techniques may be used to obtain the solution. In the following description, an approximation is used wherein the tree is regarded as a chromosome of a genetic algorithm (GA), and the optimization of the tree is made to correspond to the evolution of the chromosome.

A step S6 connects the trees of the open and closed nets to form a single tree, based on the node numbers stored in the step S3. As a result, it is possible to obtain an optimized tree with respect to the net as it was prior to the division carried out in the step S2. In other words, by optimizing each of the trees of the divided closed nets, it is possible to obtain the optimized tree with respect to the net as it was prior to being divided into the open and closed nets.

A step S7 shown in FIG.3 arranges the phase shifters with respect to the nodes of every other hierarchical level corresponding to the aperture patterns, by starting from the trunk node of the synthesized tree.

Therefore, by executing the program which includes means for realizing the above described steps S1 through S7 and is stored in the storage unit 30, it is possible to automatically and efficiently obtain the optimized phase shifter arrangement within a short time.

Next, a description will be given of an array representation of the tree.

For example, the tree X1 shown in FIG.6B can be represented by a one-dimensional array shown in FIG.9A. An array element A(j)=i indicates that a node j is connected to a node i in a hierarchical level which is one higher than that of the node j, via a real branch. This array element A(j)=i includes information related to the connection relationship and the connection direction of the nodes. When i=0, the node j is a trunk node having no higher hierarchical level. For example, A(13)=20 - - ->A(20)=21 - - ->A(21)=18 - - ->A(18)=0. By describing the complicated tree by such a one-dimensional array, it becomes possible to simplify the data processing.

FIGS.9B and 9C respectively show array representations of the trees X2 and X3 shown in FIGS.7B and 8B.

Next, a more detailed description will be given of the steps S1, S2 and S5 described above.

Figure 10:
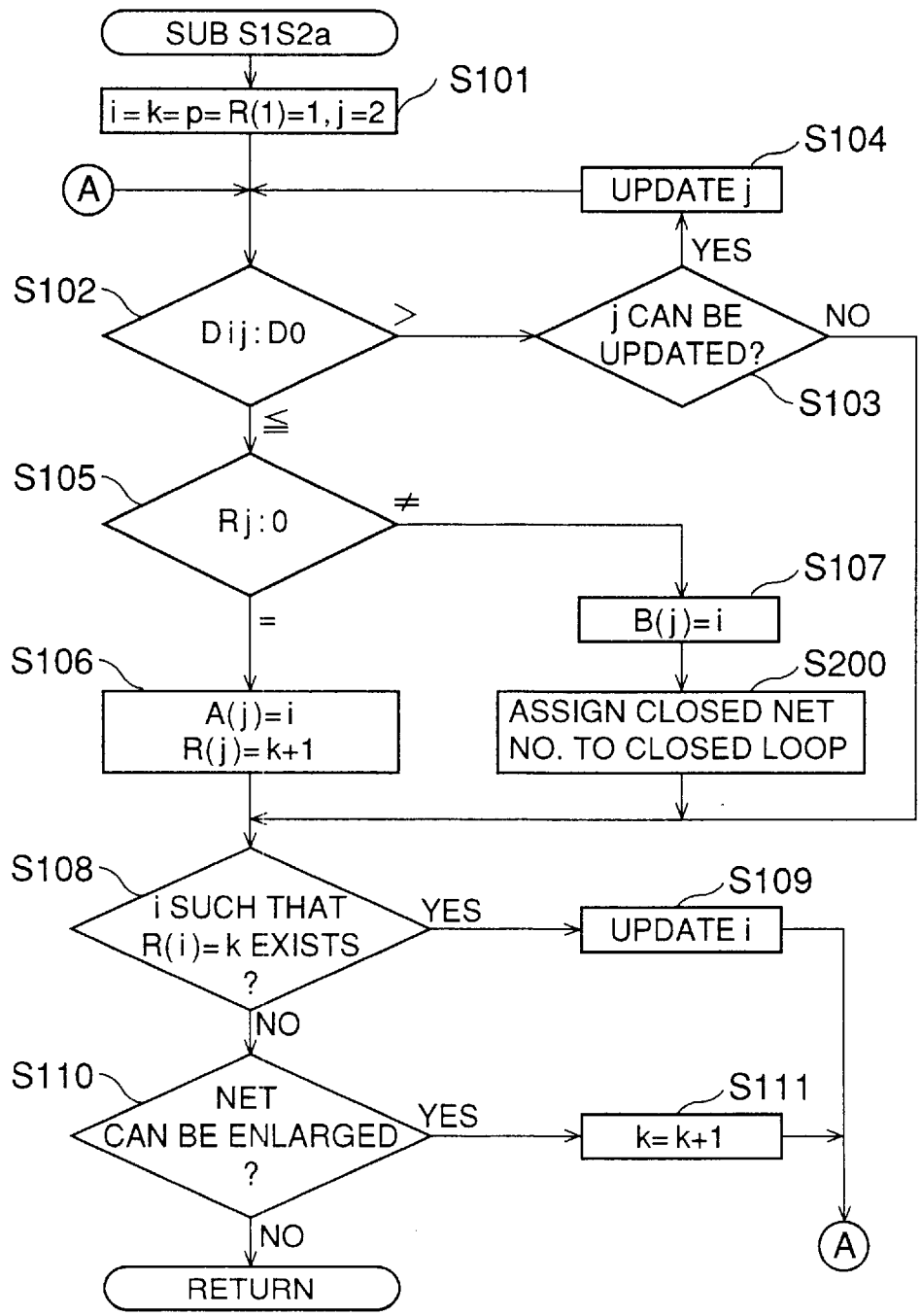
FIG.10 is a flow chart showing a portion of the process shown in FIG.3 in more detail.
Figure 11:
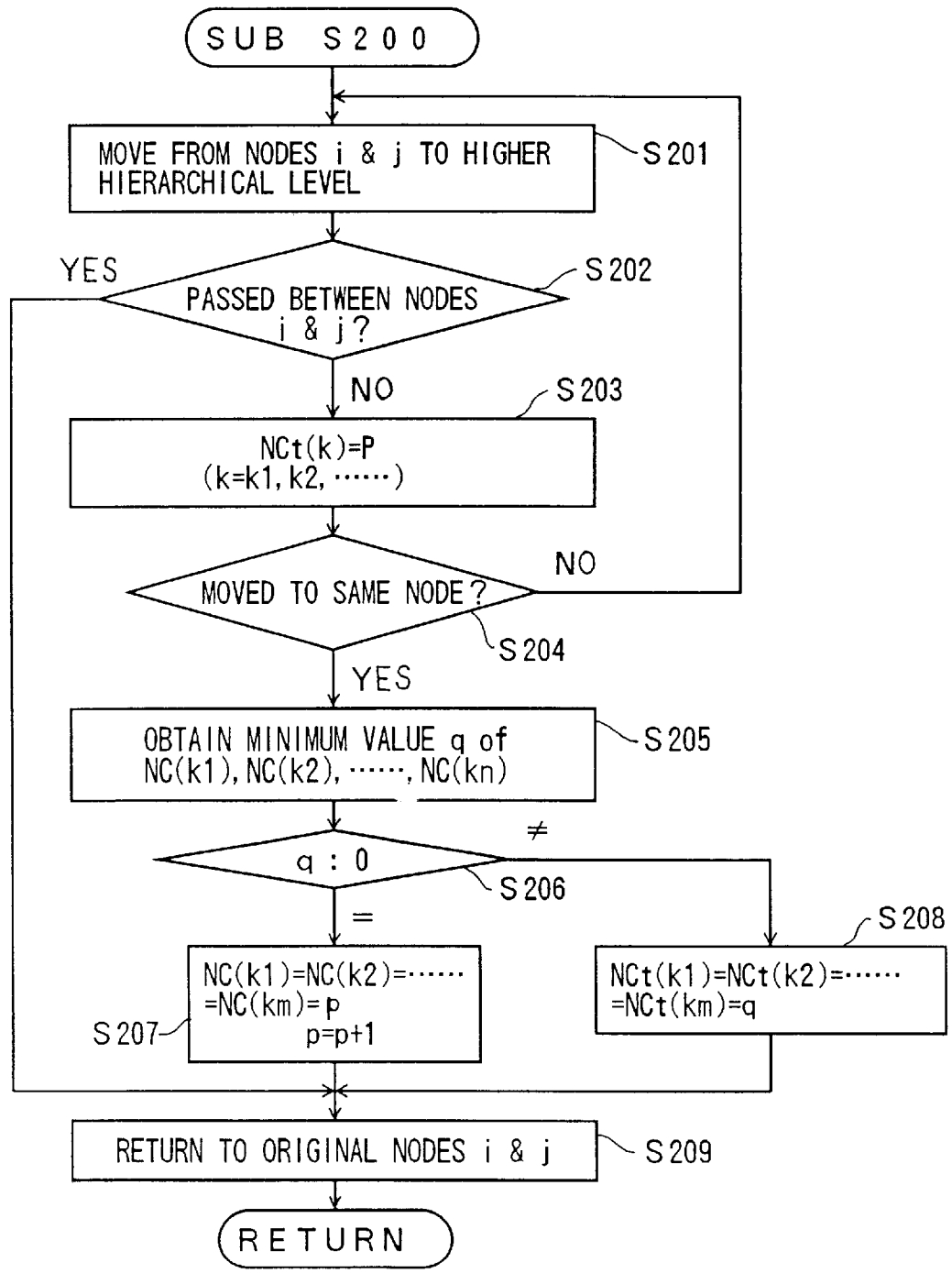
FIG.11 is a flow chart showing a portion of the process shown in FIG.10 in more detail.

Details of the Steps S1 and S2:

Portions of the steps S1 and S2 shown in FIG.3 will be described based on FIGS.10 and 11, by referring to the net 40 shown in FIG.5. In FIGS.10 and 11, it is assumed for the sake of convenience that a hierarchical level number is assigned to each node by starting from one aperture pattern, and that the net, closed nets and tree are formed. In FIG.5, each number indicated outside the circular mark denoting the node indicates the hierarchical level number.

In the following description, the following designations are used:

Dij: An interval (minimum distance) between an aperture pattern i and an aperture pattern j;

D0: A set value on the order of the wavelength of the exposing light;

NC(i): A closed net number of the node i;

NCt(i): A temporary closed net number of the node i;

R(i): A hierarchical level number of the node i having an initial value 0;

A(j)=i: An array element having an initial value 0;

B(j)=i: A connection of the node j and the node i via a void branch and having an initial value 0.

A step S101 shown in FIG.10 starts from an aperture pattern 1. In other words, the aperture pattern 1 is regarded as the trunk node 1 of the hierarchical level 1. An initial setting is made so that i=1, k=1, p=1, R(1)=1 and j=2.

Steps S102 through S104 search for the aperture pattern j which satisfies Dij<D0, and the aperture pattern j satisfying this condition Dij<D0 is regarded as the node j. More particularly, the step S102 decides whether or not Dij<D0. If Dij>D0, the step S103 decides whether or not j can be updated. If the decision result in the step S103 is YES, the step S104 updates j, and the process returns to the step S102. On the other hand, if the decision result in the step S103 is NO, the process advances to a step S108 which will be described later. Further, if Dij<D0, the process advances to a step S105.

Steps S105 and S106 sets A(j) and R(j) to A(j)=i and $R(j)=k+1$ when R(j)=0. More particularly, the step S1OS decides whether or not R(j)=0, and the step S106 sets A(j) and R(j) to A(j) =i and $R(j)=k+1$ if the decision result in the step S105 is YES.

Steps S107 and S200 sets B(j) to B(j)=i when R(j) is not equal to 0. In this case, a loop is obtained, and the closed net number is assigned to each node of this loop as shown in FIG.11. More particularly, the step S107 sets B(j) to B(j)=i, the step S200 assigns the closed net number to each node of the closed loop, and the process advances to the step S108.

FIG.11 shows the step S200 shown in FIG.10 in more detail. In FIG.11, steps S201 through S04 start from the nodes i and j and move to higher hierarchical levels via the real branches until the same node is reached, and the same closed net number p is assigned to all nodes k that are passed, where k=k1 , k2, . . ., km. In other words, NCt(k) is set to NCt(k1)=p, NCt(k2)=p, . . ., NCt(km)=p. However, no loop is formed when the branch between the nodes i and j is passed, and in such a case, the process advances to a step S209. Since each element of the array A has a unique directionality to the higher hierarchical levels, it is possible to move to the higher hierarchical levels via one path.

More particularly, the step S201 starts to move from the nodes i and j to the higher hierarchical levels. the step S202 decides whether or not the branch between the nodes i and j is passed. The process advances to the step S209 if the decision result in the step S202 is YES, but the step S203 sets NCt(s) to NCt(s)=p, where s=k1, k2, . . . . Then, the step S204 decides whether or not the same node is reached, and the process returns to the step S201 if the decision result in the step S204 is NO. The process advances to a step S205 if the decision result in the step S204 is YES.

The step S205 shown in FIG.11 obtains a minimum value q of NC(k) with respect to k=k1, k2, . . ., km.

Steps S206 through S208 set NC(k1), NC(k2), . . ., NC(km) and p to NC(k1)=p, NC(k2)=p, . . ., NC(km)=p and $p=p+1$ if q=0, and set NCt(k1), NCt(k2), . . ., NCt(km) to NCt(k1)=q, NCt(k2) =q, . . ., NCt(km)=q if q is not equal to 0. More particularly, the step S06 decides whether or not q=0. If the decision result in the step S206 is YES, the step S207 sets NC(k1), NC(k2), . . ., NC(km) and p to NC(k1)=p, NC(k2)=p, . . ., NC(km)=p and p=p+1, and the process advances to the step S209. On the other hand, if the decision result in the step S206 is NO, the step S08 sets NCt(k1), NCt(k2), NCt(km) to NCt(k1)=q, NCt(k2)=q, . . ., NCt(km) =q, and the process advances to the step S209.

The step S209 returns to the original nodes i and j prior to the start of the movement in the step S201.

In the case shown in FIG.5, the following relationships stand when k=1 and i=1.

$j=2:A(2)=1, R(2)=2$ $j=10:A(10)=1, R(10)=2$

The following relationships stand when k=2 and i=2.

$j=3:A(3)=2, R(3)=3$ $j=9:A(9)=2, R(9)=3$ $j=10:B(10)=2$

NCt(1)=NCt(2)=NCt(10)=1 Since NC(1)=NC(2)=NC(10)= 0, NC0(1)=NC(2)=NC(10)=1 and p=p+1=2. Accordingly, the following relationships stand when k=3 and i=3.
j=9:B(9)=3
NCt(2)=NCt(3)=NCt(9)=2 Therefore, because NC(2)=1, NC(3)=NC(9)=1.

Steps S108 and S109 shown in FIG.10 return the process to the step S102 if another i satisfying R(i)=k exists. Only one i that satisfies R(i)=1 exists. In other words, the step S108 decides whether or not i satisfying R(i)=k exists, and the step S109 updates i if the decision result in the step S108 is YES. The process returns to the step S102 after the step S109. The process advances to a step S110 if the decision result in the step S108 is NO.

Steps S110 and S111 ends the process if not even one aperture pattern j satisfying Dij<D0 can be found. Otherwise, k is set to k=k+1, and the process returns to the step S102. In other words, the step S110 decides whether or not the net can be enlarged, and the step S111 sets k to k=k+1 if the decision result in the step S110 is YES. The process advances to the step S102 after the step S111. On the other hand, the process ends if the decision result in the step S110 is NO.

Therefore, an independent net is extracted by the above described process, and this extracted net is divided into open and closed nets. In addition, the trees are created. The net numbers of the closed nets remain at the initial value 0.

The division of the extracted net into the open and closed nets as described above corresponds to a case where, in the net 40 shown in FIG.5, for example, A(12)=10 is set to A(12)=0 and the node 12 is set as the trunk node of the open net 42, and A(18)=24 is set to A(18)=0 and the node 18 is set as the trunk node of the closed net 43. The trunk node of the net 41 matches the trunk node of the net 40, and is already determined.

The step S3 shown in FIG.3 corresponds to a case where, prior to creating the trunk nodes described above, A(12)=10 and A(18)=24 are stored. The step S6 corresponds to a case where, A(12)=0 and A(18)=0 are returned to the original A(12)=10 and A(18)=24.

Figure 12:
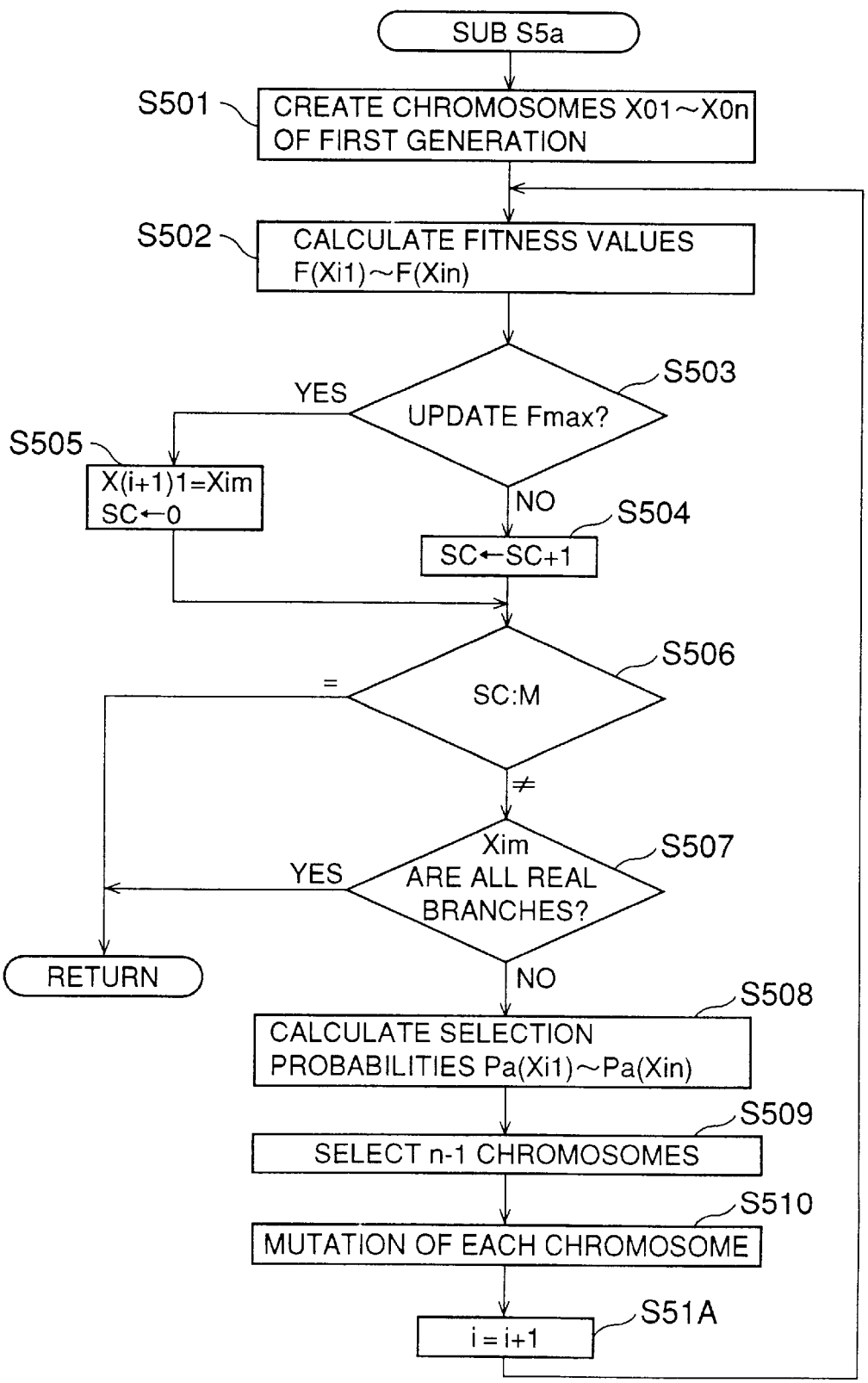
FIG.12 is a flow chart showing another portion of the process shown in FIG.3 in more detail.

Details of the Step S5:

FIG.12 shows a portion of the step S5 shown in FIG.3 in more detail. The step S5 carries out the process shown in FIG.4 with respect to all of the closed nets.

In FIG.12, the tree is regarded as the chromosome of the genetic algorithm (GA) and the tree is changed or modified. The operation of modifying the chromosome can be realized by mutation or crossover, but in this embodiment, only the mutation will be considered in order to simplify the description.

A jth chromosome of a ith generation will be denoted by Xij.

Chromosomes having a one-dimensional array will be treated in the GA, but the tree of the closed net is not one-dimensional, and it requires ingenuity to use the GA.

In FIG.12, a step S501 creates n chromosomes X01 through X0n of a first generation. The tree obtained in the step S4 shown in FIG.3 can be used as one of these n chromosomes, and the remaining (n−1) chromosomes are created. For example, a mutation of a step S510 which will be described later is carried out (n−1) times or, (n−1) trunk nodes are selected at random, and the tree is created from the net as described above with respect to each mutation or trunk node.

A step S502 calculates an fitness value F(Xij) of the chromosome Xij for j=1 to n.

The fitness value F(Xij) becomes larger as the total number I of contradictory branches becomes smaller. Hence, the fitness value F(Xij) of the chromosome Xij is defined by the following formula (1) using the total number I (Xij) of contradictory branches, where I(X00) denotes a value used to facilitate the evaluation of the value of the fitness value F(Xij), X00 denotes a tree that is obtained in the step S4, for example, and θ denotes a small positive constant used to prevent an overflow when I(Xij) becomes 0 and a division is made.

$$F(Xij) = I(X00) / \{I(Xij) + \theta\} \qquad (1)$$

A step S503 obtains a maximum value F(Xim) of the fitness values F(Xi1) through F(Xin), and decides whether or not to update a maximum value Fmax up to the previous generation. In other words, the maximum value Fmax is updated to Fmax=F(Xim) when the maximum value F(Xim) is greater than the maximum value Fmax up to the previous generation, and the process advances to a step S505. Otherwise, the process advances to a step S504.

The step S504 increments a stop counter SC within the computer 29.

The step S505 updates the best chromosome. In other words, a best chromosome Xim corresponding to the maximum fitness value Fmax is set as a chromosome X(i+1)1 of the next generation. In addition, the stop counter SC is cleared to 0, and the process advances to a step S506.

The step S506 decides whether or not the stop counter SC is equal to a preset constant M. If the decision result in the step S506 is YES, it is judged that the maximum fitness value Fmax has converged, and the process shown in FIG.12 ends.

Figure 13:
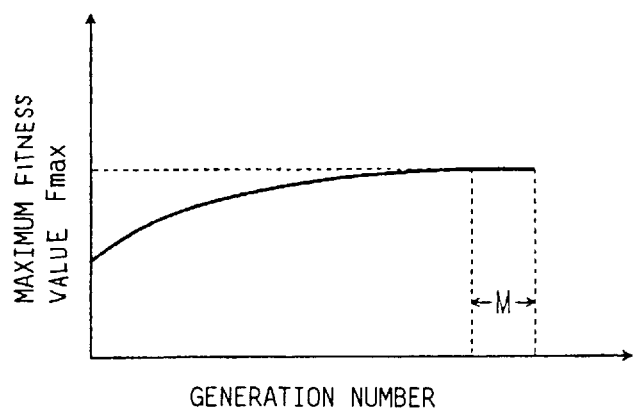
FIG.13 is a diagram showing a change in a maximum fitness value with respect to a generation number.

FIG.13 shows a change of the maximum fitness value Fmax with respect to a change in the generation.

On the other hand, if the decision result in the step S506 is NO, a step S507 decides whether or not all of the branches of the best chromosome Xim are real branches. If the decision result in the step S507 is YES, an optimum solution I(Xim)=0 is obtained. Hence, in this case, it is judged that the maximum fitness value Fmax has converged, and the process shown in FIG.12 ends.

But if the decision result in the step S507 is NO, a step S508 calculates a selection probability Pa(Xij) of the chromosome Xij for j=1 to n. The selection probability Pa(Xij) can be calculated from the following formula (2), where a denotes an emphasizing factor.

$$Pa(Xij) = F(Xij)^a / \sum_{j=1}^{n} F(Xij)^a \qquad (2)$$

A chromosome having a high fitness value is more easily selected when a >1, and a is equal to 2, for example.

A step S509 selects (n−1) chromosomes out of the (n−1) chromosomes Xii through Xi(m−1) and Xi(m+1) through Xin excluding the best chromosome Xim. For example, a random number rnd satisfying 0 <rnd <1 is generated, and a chromosome Xik is selected when the following relationship (3) is satisfied.

$$\sum_{j=1}^{k-1} Pa(Xij) \leq rnd < \sum_{j=1}^{k} Pa(Xij) \qquad (3)$$

$$\text{where } \sum_{j=1}^{k-1} Pa(Xij) = 0$$

The probability that the same chromosome is selected a plurality of times increases as the selection probability increases.

A step S510 creates (n−1) chromosomes X(i+1)2 through X(i+1)n of a (i+1)th generation by carrying out the mutation with respect to each of the selected (n−1) chromosomes.

A step S51A sets i to i=i +1, and the process returns to the step S502.

Figure 14:
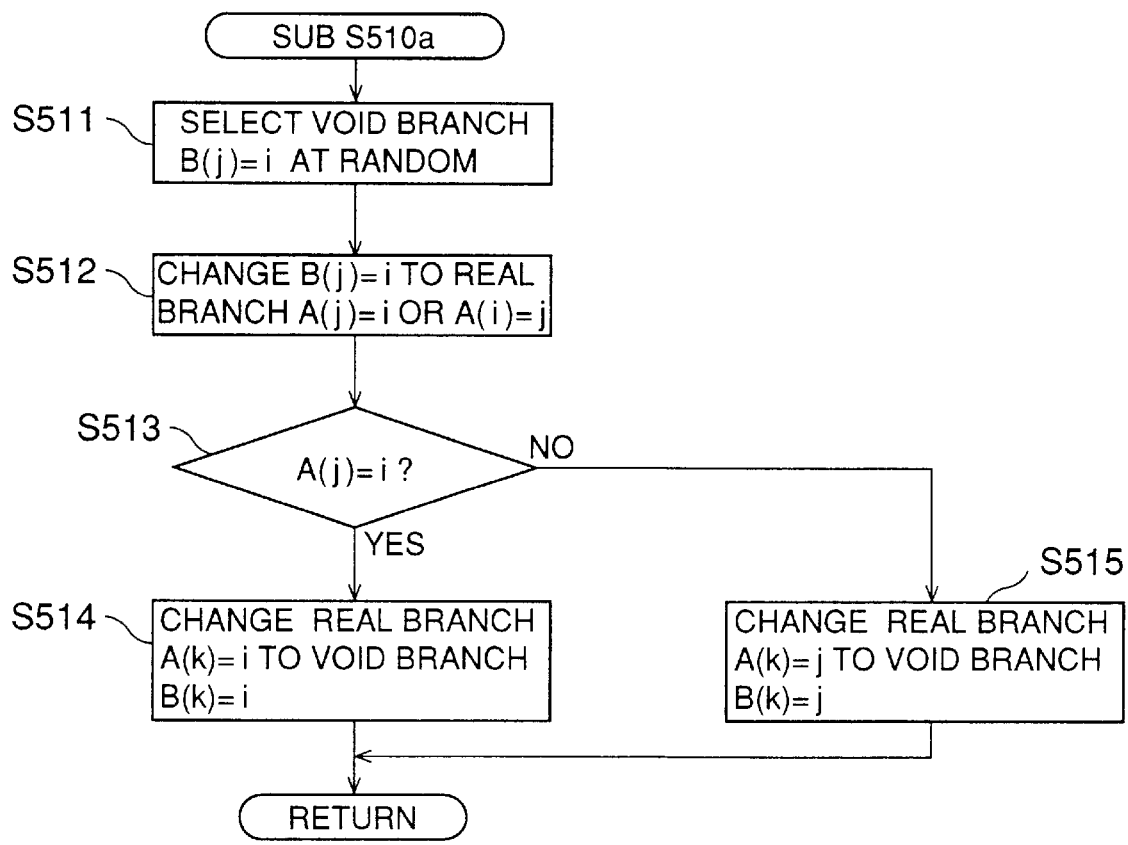
FIG.14 is a flow chart showing a portion of the process shown in FIG.12 in more detail.

FIG.14 shows a portion of the step S510 shown in FIG.12 in more detail. The step S510 carries out the process shown in FIG.14 with respect to each of the (n−1) selected chromosomes.

In FIG.14, a step S511 selects a void branch B(j)=i at random. For example, a void branch B(2)=5 shown in FIG.6A is selected.

A step S512 modifies the void branch B(j)=i at random to a real branch A(j)=i or A(i)=j. FIG.7A shows a case where the void branch B(13)=19 is modified to a real branch A(13)=19. FIG.8A shows a case where the void branch B(13)=19 is modified to a real branch A(19)=13.

A step S513 decides whether or not the void branch B(j)=i is modified to the real branch A(j)=i. If the decision result in the step S513 is YES, a step S514 modifies the real branch A(k)=i from the node i to the node k in a hierarchical level 1 higher than that of the node i, to a void branch B(k)=i, in order to make the number of real branches from the node i to a node in the hierarchical level 1 higher than that of the node i to one. On the other hand, if the void branch B(j)=i is modified to the real branch A(j)=j and the decision result in the step S513 is NO, a step S515 modifies the real branch A(k)=j from the node j to the node k in a hierarchical level 1 higher than that of the node j, to a void branch B(k)=j, in order to make the number of real branches from the node j to a node in the hierarchical level 1 higher than that of the node j to one. The process shown in FIG.14 ends after the step S514 or S515.

Next, a description will be given of a second embodiment of the phase shifter arranging method according to the present invention.

Figure 15:
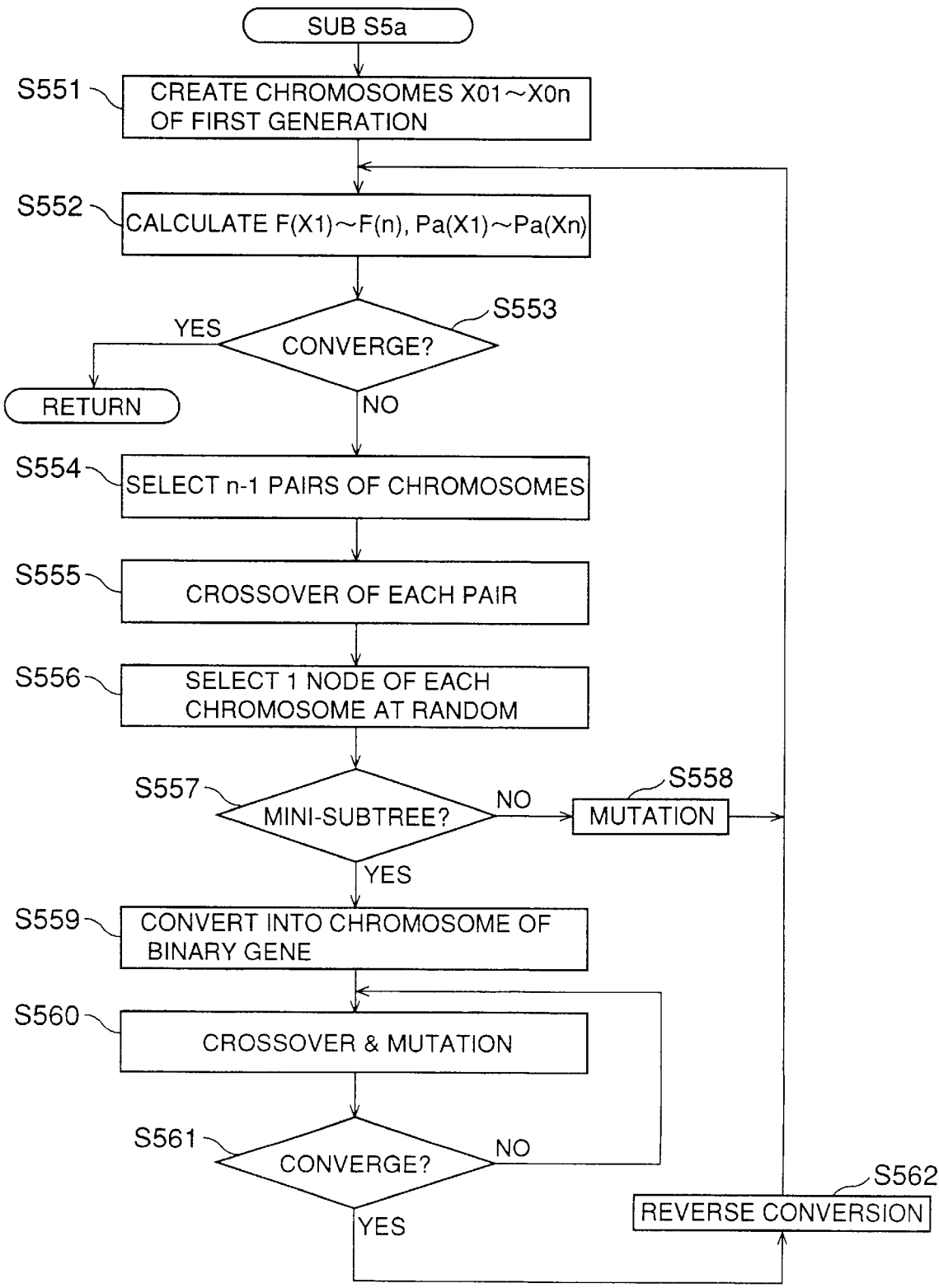
FIG.15 is a flow chart for explaining the operation of a second embodiment of the phase shifter arranging method according to the present invention.

FIG.15 is a flow chart for explaining the operation of this second embodiment. More particularly, since the basic operation of this second embodiment is similar to that of the first embodiment shown in FIG.3, FIG.15 only shows a portion of the process corresponding to the step S5 shown in FIG.3. Hence, the operation of FIG.15 corresponds to the operation of the first embodiment shown in FIG.12.

In FIG.15, a step S551 carries out a process similar to that of the step S501 shown in FIG.12. In addition, steps S552 and S553 carry out process similar to those of the steps S502 through S508 shown in FIG.12. However, the selection probability Pa in this second embodiment, that is, the selection probabilities of the chromosomes of the mother and father in the crossover are set different by the value of a. The chromosome is better as the fitness value becomes higher, but there are cases where good chromosomes exist in parts even when the fitness value is low. Hence, such parts and parts of the good chromosomes are switched, so as to expect creation of even better chromosomes. For example, a=2 is used for the selection of the mother chromosome, and a=1 is used for the selection of the father chromosome. In other words, P1(Xi1) through P1(Xin) and P2(Xi1) through P2(Xin) are obtained.

A step S554 selects (n−1) pairs of parent chromosomes by using different selection probabilities for the mother and father.

Figure 16A:
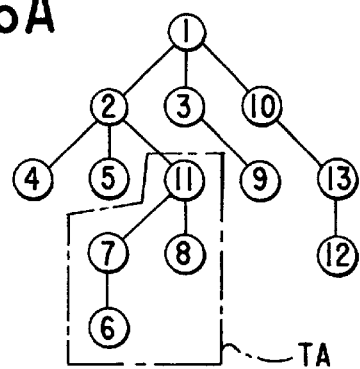
FIGS.16A through 16E respectively are diagrams showing chromosome structures for explaining a portion of the process shown in FIG.15.
Figure 16B:
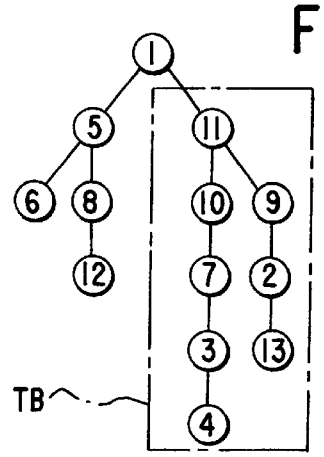

A step S555 makes the crossover with respect to each pair of chromosomes. For example, the mother and father chromosomes respectively are as shown in FIGS.16A and 16B. For the sake of convenience, it is assumed that the node 11 is selected when one of the nodes 1 through 13 is selected at random as the crossover point. In this case, a chromosome in which a subtree TA beyond the node (gene) 11 of the mother is switched with a subtree TB beyond the node 11 of the father is generated as the child chromosome, so as to expect the child chromosome to be better than the mother chromosome.

On the other hand, the chromosome evolves with the generation, and the connection states of the nodes should be maintained as much as possible.

Figure 16C:
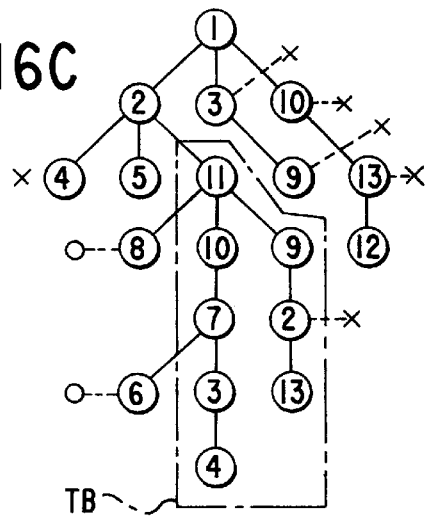

Hence, as shown in FIG.16C, the subtree TA is replaced by the subtree TB, and the nodes 6 and 8 which are eliminated by this replacement are added to the subtree TB so as to maintain the original connections A(6)=7 and A(8)=11.

In addition, it is necessary to delete the nodes which appear twice (hereinafter simply referred to as overlapping nodes) in the child chromosome. In this case, it is assumed that the subtree TB of the father is the best, and the overlapping nodes are deleted so as not to destroy the shape of the subtree TB. In other words, when overlapping nodes exist, the nodes of the mother are deleted as a rule. However, in order not to destroy the connection of the mother chromosome and the father chromosome, the connections from the node 11 to the trunk node 1 via the real branches are maintained as an exception.

Figure 16D:
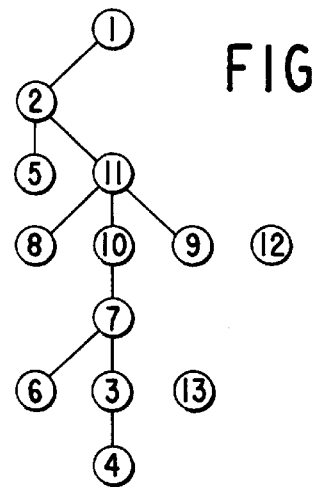

In this embodiment, the nodes indicated by a symbol "X" in FIG.16C are deleted from the overlapping nodes, and a connection shown in FIG.16D is obtained.

Figure 16E:
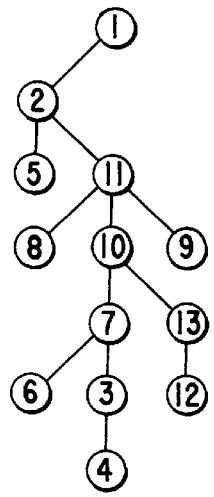

Next, the nodes 12 and 13 having no branches in FIG.16D are added so as to maintain the node connections of the mother, and the child chromosome shown in FIG.16E is generated.

When making the crossover using the array representation, the array representations of the connections shown in FIGS.16A through 16E respectively become as shown in FIGS.17A through 17E.

Figures 17A, 17B, 17C, 17D, 17E:
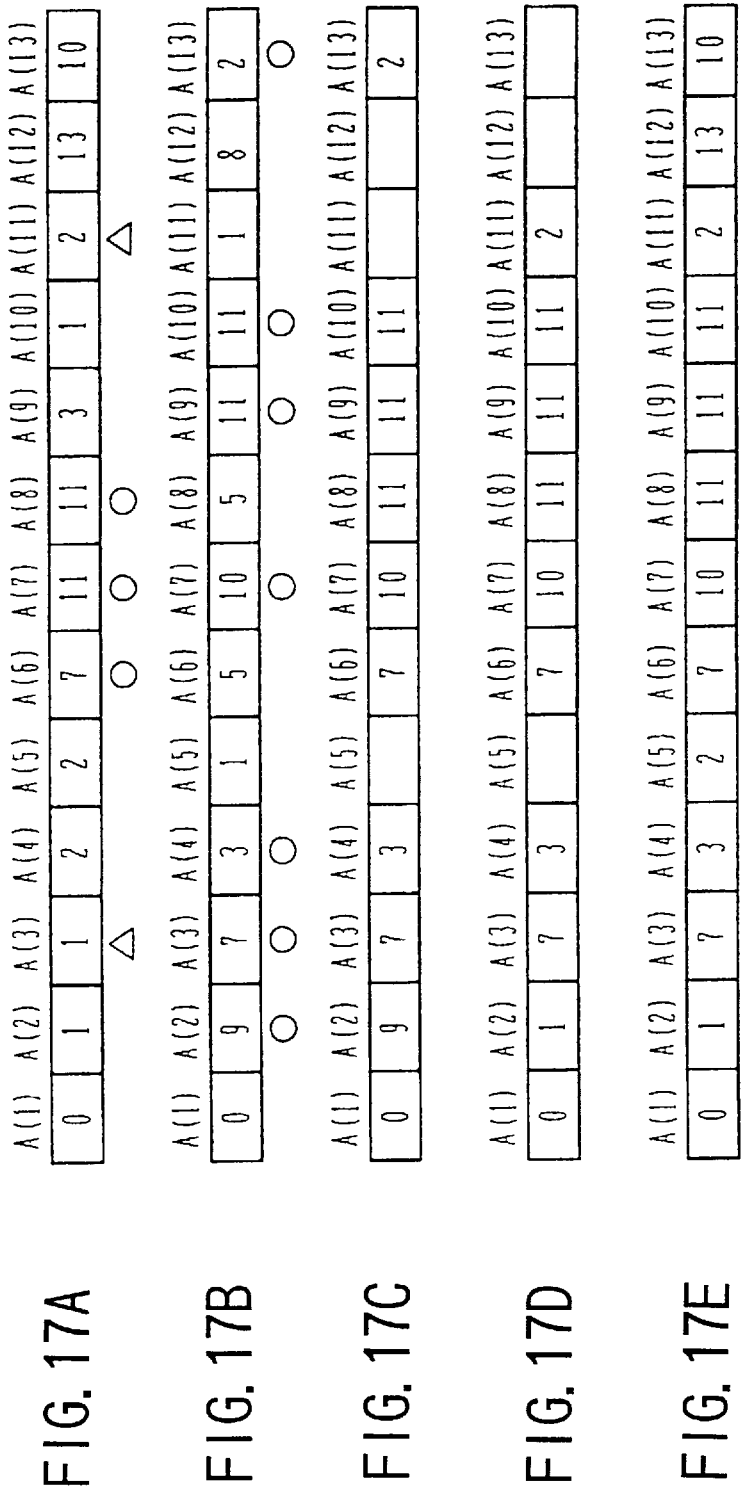
FIGS.17A through 17E respectively are diagrams showing array representations for the chromosome structures shown in FIGS.16A through 16E.

That is, the real branches of the subtrees TA and TB, indicated by circular marks in FIGS.17A and 17B, are extracted by giving priority to the real branches of the subtree TB, and the trunk node 1 is extracted, so as to create the array shown in FIG.17C.

Then, the real branches A(11)=2- - ->A(2) =1 indicated by triangular marks in FIG.17A are extracted from the mother chromosome and added to the array shown in FIG.17C, so as to create the array shown in FIG.17D. In this case, the same array element A(2)=9 which already exists in FIG.17C is replaced. In addition, A(11)=2 which has the same value as A(13)=2 is deleted.

Next, the real branches A(5)=2, A(12)=13 and A(13)=10 of the mother chromosome are inserted into the blank portions of the array shown in FIG.17D. As a result, the array shown in FIG.17E corresponding to FIG.16E is obtained.

Returning now to the description of FIG.15, a step S556 selects the void branch and the node at one end of the void branch at random with respect to each of the (n−1) chromosomes which are obtained by the crossover.

A step S557 decides whether or not a subtree having the node selected by the step S556 as the trunk node is a mini-subtree T. The subtree is regarded as the mini-subtree T when the number of nodes in the subtree T is less than or equal to a predetermined number which is 50, for example. The process advances to a step S558 if the decision result in the step S557 is NO, and the process advances to a step S559 if the decision result in the step S557 is YES.

The step S558 regards the void branch selected by the step S556 as the void branch of the step S511 shown in FIG.14, and carries out the mutation similarly to the process shown in FIG.14, so as to expect evolution of the chromosome. The process returns to the step S552 after the step S558.

Figure 18:
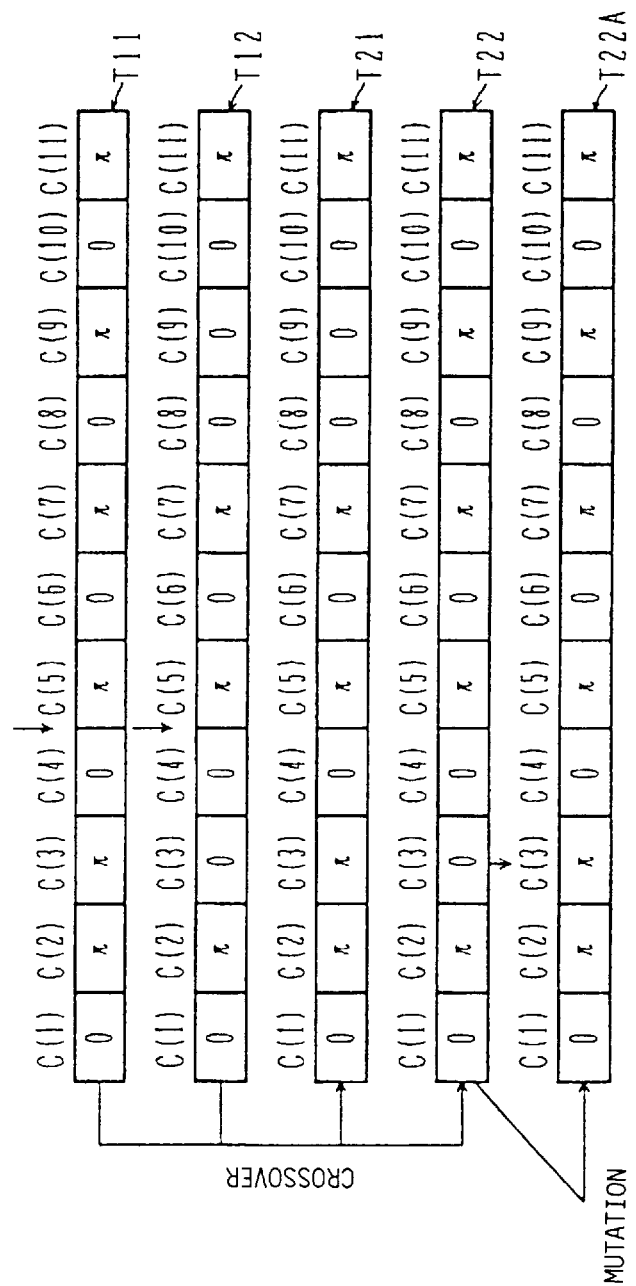
FIG.18 is a diagram for explaining another portion of the process shown in FIG.15.

The step S559 converts the mini-subtree T into a chromosome having a one-dimensional array of binary genes, in order to optimize the mini-subtree by a simple method. With respect to the mini-subtree T, the phase shift is applied to each node as shown in FIG.6B, for example, and the chromosome having genes C(i) arranged therein is created by use of a representation $C(i)=\alpha$ when the phase shift of the node i is denoted by $\alpha$. FIG.18 shows one example of a chromosome T11 which is obtained in this manner. In FIG.18, the phase shift a is represented by "0" or "1" because the phase shift a is a binary value. A mutation is carried out with respect to the chromosome T11, and m chromosomes of the first generation are created.

Steps S560 and S561 obtain the fitness value and the selection probability with respect to the m chromosomes of the mini-subtree T, based on the formulas (1) and (2) described above. In addition, the crossover and mutation are repeated until the maximum fitness value converges, similarly to the process shown in FIG.12 except for the step S510.

Instead of the step S510 shown in FIG.12, the following crossover and mutation are carried out.

That is, the crossover uses the general genetic algorithum (GA). For example, one of integers "1" through "10" is selected at random with respect to the mother chromosome T11 and the father chromosome T12 of the first generation, for example. When the integer "4" is selected, a chromosome T21 made up of a connection of C(1) through C(4) of the mother chromosome T11 and C(5) through C(11) of the father chromosome T12, and a chromosome T22 made up of a connection of C(1) through C(4) of the father chromosome T12 and C(5) through C(11) of the mother chromosome T11 are created as shown in FIG.18.

The mutation also uses the general GA. For example, one of the integers "1" through "10" is selected at random with respect to the chromosome T22, for example. When the integer "3" is selected, a chromosome T22A shown in FIG.18 is created by inverting the value "0" of C(3) to "1" and maintaining the other array elements as they are.

Therefore, the step S560 carries out the crossover and mutation, and the step S561 decides whether or not the maximum fitness value converges. The process returns to the step S560 if the decision result in the step S561 is NO, but the process advances to a step S562 if the decision result in the step S561 is YES.

The step S562 makes a reverse conversion of the chromosome having the maximum fitness value into the subtree, and the process returns to the step S552. In other words, the subtree is created so that the phase shift changes for each hierarchical level.

The local optimization described above can be carried out at a high speed. In addition, the crossover of the step S555 is carried out so that the good portions of the chromosome are maintained as much as possible. As a result, this embodiment is effective in that a better optimum solution can be obtained.

Next, a description will be given of a third embodiment of the phase shifter arranging method according to the present invention. This third embodiment further improves the second embodiment on the following two points.

(1) Creation of Initial Tree Depending on Load:

In FIG.4A for example, the even if an interval D12 between the aperture patterns 1 and 2 is D0 or less, it is more desirable to make the phase difference between the aperture patterns 1 and 2 equal to π as the interval D12 becomes smaller and a length L12 less than D0 becomes larger. On the other hand, the phase difference between the nodes at both ends of the real branch always becomes π.

Accordingly, a load Hij between the aperture patterns i and j is defined by the following formula (4), where D1 denotes the Rayleigh's resolution limit, for example.

$$Hij = Lij \star (D1 - Dij) \qquad (4)$$

If the interval between the aperture patterns i and j is D0 or less for two or more sides of the aperture, a sum total of the values for the right term $Lij \star (D1-Dij)$ of the formula (4) for each of the sides is regarded as the load Hij. Before optimizing the closed net, the load is calculated for the intervals of all of the nodes within the closed net, and the calculated loads are sorted in order starting from the largest load. The tree is formed by selecting the real branch with priority from the largest load.

In FIG.4A, for example, the following is obtained by the sorting.

$$H12 > H23 > H29 > H39 > H1(10) > H2(10) > H9(10)$$

The real branches are created with priority starting from the largest load, so that the element number of the array will not be duplicated. In this case, a flag is set with respect to a node which is already selected as the element number of the array, and the nodes with no set flag are selected as the element numbers. In the above described case, the following array is created.

$$A(1)=2, A(2)=3, A(9)=2, A(3)=9, A(10)=1$$

Next, one branch of the loop is deleted to determine the trunk node, and the tree is completed. In the above described case, the nodes 2 - - ->3 - - ->9 - - ->2 form a loop, and one of A(2), A(3) and A(9), such as A(2) having the largest load, for example, is changed to A(2)=0.

By creating the initial tree in the above described manner, the initial level of evolution of the chromosome becomes high in the optimization process, and it is easier to obtain a more optimized phase shifter arrangement.

(2) Minimization of Sum Total of Loads of Contradictory Branches:

Even for the same number of contradictory branches having the phase difference 0, in general, it is more preferable that the sum total of the loads of the contradictory branches is smaller. Hence, the sum total of the loads of the contradictory branches is used in place of the sum total I of the contradictory branches. The calculation of the sum total of the loads of the contradictory branches corresponds to the calculation of the sum total of the contradictory branches which are weighted by the loads.

By using the sum total of the loads of the contradictory branches, it is easier to obtain a more optimized phase shifter arrangement.

Figure 19:
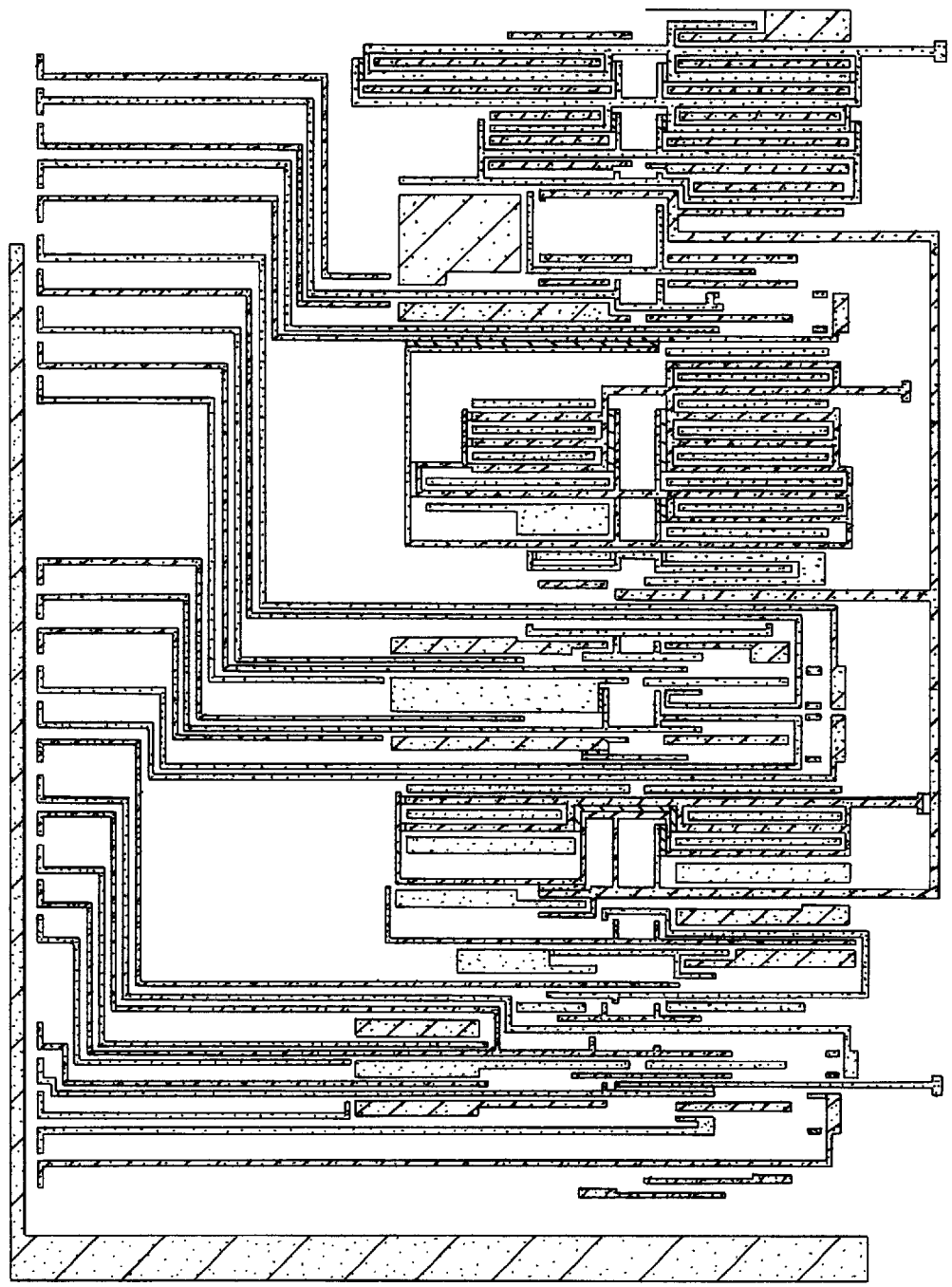
FIG.19 is a plan view showing actual patterns applied with a third embodiment of the phase shifter arranging method according to the present invention.
Figure 20:
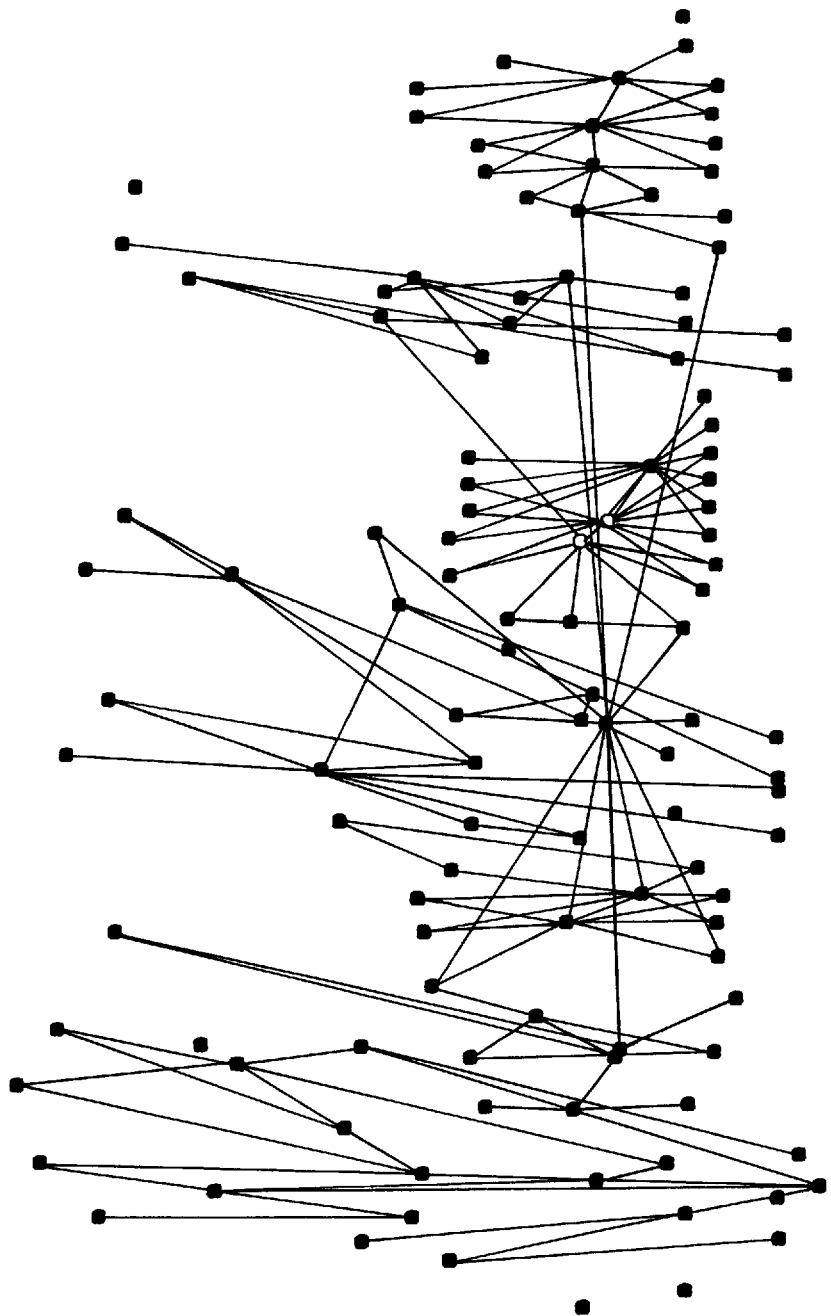
FIG.20 is a diagram showing a net corresponding to the patterns shown in FIG.19 obtained by the third embodiment.

When the steps S559 through S562 shown in FIG.15 are omitted so that the process advances from the step S556 to the step S558 in this third embodiment, results shown in FIG.19 and 20 were obtained by applying this third embodiment to a portion of the actual patterns.

FIG.19 is a plan view showing 125 actual patterns, and the phase shifter was arranged on one of the patterns indicated in black and the patterns indicated in gray (region with dots). On the other hand, FIG.20 is a diagram showing a net which is formed based on the patterns shown in FIG.19. The net shown in FIG.20 was obtained by taking the center of gravity of each pattern as the node. In the net shown in FIG.20, there were 12 contradictory branches.

In FIG.19, contradictory portions are indicated by the hatching. In addition, the contradictory branches are indicated by a bold line.

Next, a description will be given of the manner in which the contradictory portions and ranges are greatly reduced according to the present invention, by referring to FIGS.21 through 25.

Figure 21:
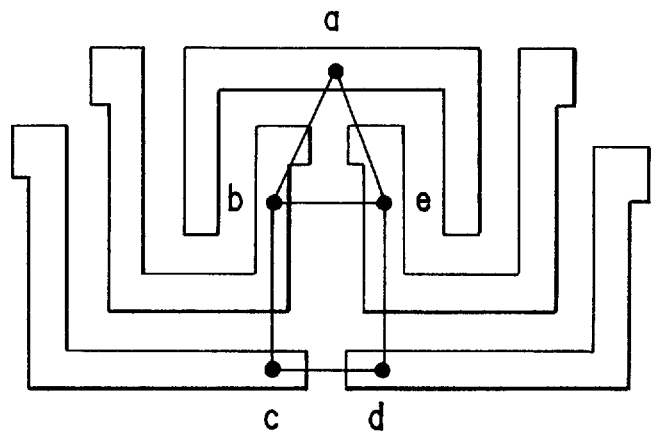
FIG.21 is a diagram showing a photomask pattern and a net thereof.

FIG.21 is a diagram showing a photomask pattern including aperture patterns a, b, c, d and e. In FIG.21, a net which is formed by taking the aperture patterns a through e as nodes, is also indicated by a bold line for the sake of convenience.

Figure 22:
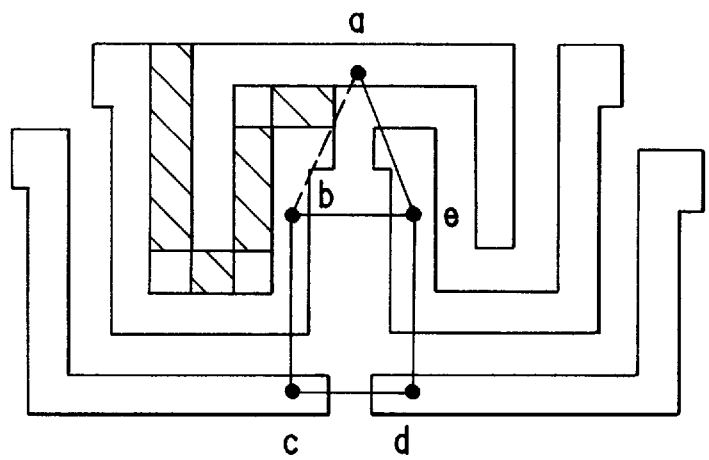
FIG.22 is a diagram showing actual patterns and a net which were obtained for the photomask pattern shown in FIG.21 using a conventional phase shifter arranging method.
Figure 23:
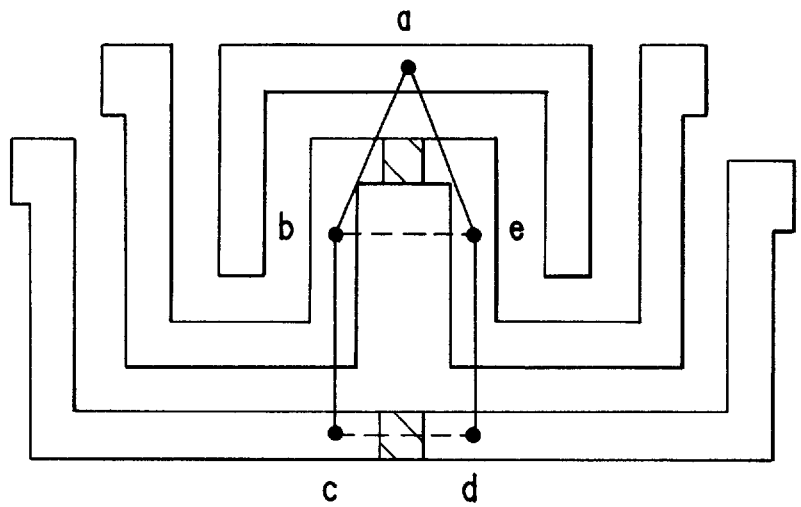
FIG.23 is a diagram showing actual patterns and a net which were obtained for the photomask pattern shown in FIG.21 using the phase shifter arranging method according to the present invention.

FIG.22 is a diagram showing the actual patterns and the net which were obtained by applying a conventional phase shifter arranging method to the photomask pattern shown in FIG.21. For example, the conventional phase shifter arranging method proposed in A. Moniwa et al., "Heuristic Method for Phase-Conflict Minimization in Automatic Phase-Shift Mask Design", Jpn. J. Appl. Phys. Vol.34 (1995), pp.6584–6589, Part 1, No.12B, December 1995 was used. On the other hand, FIG.23 is a diagram showing the actual patterns and the net which were obtained by applying the phase shifter arranging method according to the present invention to the photomask pattern shown in FIG.21. In FIGS.22 and 23, the contradictory branches of the net are indicated by the dotted line, and the corresponding contradictory portions of the actual patterns are indicated by the hatching.

Figure 24:
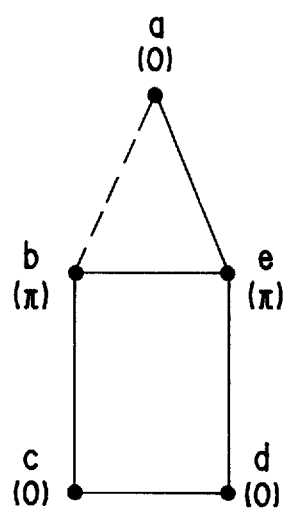
FIG.24 is a diagram showing phase shifts of phase shifters in correspondence with FIG.22.
Figure 25:
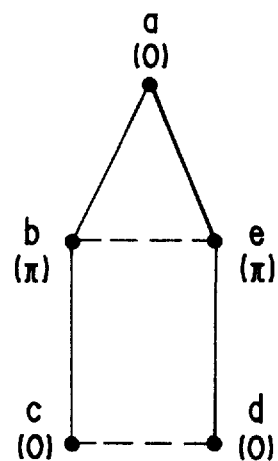
FIG.25 is a diagram showing phase shifts of phase shifters in correspondence with FIG.23.

In addition, FIG.24 shows the phase shifts of the phase shifters in correspondence with FIG.22, and FIG.25 shows the phase shifts of the phase shifters in correspondence with FIG.23. In other words, in the case of the actual patterns shown in FIG.22, the phase shifters are arranged at the aperture patterns c and e corresponding to the nodes c and e having the phase shift π(radians) in FIG.24. Similarly, in the case of the actual patterns shown in FIG.23, the phase shifters are arranged at the aperture patterns b and e corresponding to the nodes b and e having the phase shift π(radians) in FIG.25.

According to the phase shifter arrangement shown in FIGS.22 and 24 obtained by the conventional phase shifter arranging method, the branch between the nodes a and b in the net is a contradictory branch, and 4 contradictory portions exists in the actual pattern. Hence, the number of contradictory portions was large, and in addition, the contradictory portions extended over large ranges.

On the other hand, according to the phase shifter arrangement shown in FIGS.23 and 25 obtained by the present invention, although the branches between the nodes c and d and between the nodes b and e in the net are contradictory branches, only 2 contradictory portions exists in the actual pattern. In addition, the contradictory portions are limited to extremely small ranges (areas). For this reason, it was confirmed that the present invention can greatly reduce the contradictory portions and ranges thereof as compared to the conventional phase shifter arranging method.

Further, the present invention is not limited to these embodiments, but various variations and modifications may be made without departing from the scope of the present invention.

What is claimed is:

1. A phase shifter arranging method which selectively arranges phase shifters on aperture patterns of a photomask so that a phase difference of πradians occurs between lights transmitted through mutually adjacent aperture patterns of the photomask, said phase shifter arranging method being computer-implemented and comprising the steps of:

(a) extracting connections of nodes via branches as a net, where each aperture pattern is taken as a node, and mutually adjacent aperture patterns having an interval less than or equal to a predetermined value D0 are taken as nodes connected via a branch;

(b) dividing said net into an open net and a closed net which are independent of each other, said open net having no closed loop, said closed loop being other than said open loop; and (c) selectively arranging the phase shifters with respect to each of mutually independent closed nets.

2. The phase shifter arranging method as claimed in claim 1, wherein said step (b) comprises the steps of:

moving between the nodes via the branch in said net to find a closed loop, and assigning a closed net number to each of the nodes forming said closed loop;

assigning the same closed net number to a node which is common to different closed nets; and taking a connection of the nodes assigned with the same closed net number via the branches as an independent closed net, and taking a connection of the nodes having no closed net number assigned thereto via the branches as an independent open net.

3. The phase shifter arranging method as claimed in claim 1, wherein said step (c) comprises the steps of:

obtaining a connection of the nodes of said closed net via real branches as a tree, where said real branch is a single path through which a movement from a node other than a trunk node to said trunk node via the branch is possible; and arranging the phase shifters on aperture patterns corresponding to nodes in every other hierarchical level when said trunk node is in a first hierarchical level and a node in a (i+1)th hierarchical level is reached from said trunk node by passing through i real branches.

4. The phase shifter arranging method as claimed in claim 3, wherein said step (c) further comprises the steps of:

modifying the tree;

obtaining, out of void branches other than the real branches of the tree, a void branch having or not having the phase shifters on both nodes at both ends thereof, as a contradictory branch; and obtaining a tree corresponding to a minimum value of a sum total of weighted contradictory branches.

5. The phase shifter arranging method as claimed in claim 4, wherein weights of all of said weighted contradictory branches are 1.

6. The phase shifter arranging method as claimed in claim 4, wherein a weight of the weighted contradictory branch becomes larger as a value D becomes smaller and becomes smaller as a value L becomes larger, where said value D is approximately an interval between two aperture patterns corresponding to both ends of said weighted contradictory branch.

7. The phase shifter arranging method as claimed in claim 4, which further comprises the steps of:

(d) modifying said tree using random numbers; and (e) stopping modification of said tree when said minimum value of the sum total is not updated for a predetermined number of times in succession or said void branch no longer exists.

8. The phase shifter arranging method as claimed in claim 7, wherein said step (d) modifies one or more trees based on a genetic algorithm.

9. The phase shifter arranging method as claimed in claim 8, wherein said genetic algorithm includes a mutation, and said mutation comprises the steps of:

selecting one tree based on a probability which depends on said sum total;

selecting one void branch at random and changing said one void branch into a real branch with respect to the selected one tree; and changing a real branch connecting a first node at one end of the selected one void branch and a second node in a hierarchical level which is one level higher than that of said first node into a void branch.

10. The phase shifter arranging method as claimed in claim 8, wherein said genetic algorithm includes a crossover, said crossover comprising the steps of:

selecting first and second trees of the same closed net at random based on a probability which depends on said sum total;

selecting one of the nodes at random from each of said first and second trees;

replacing a first sub-tree having the selected one node from the first tree as a sub-trunk node by a second sub-tree having the selected one node from the second tree as a sub-trunk node;

adding nodes included in the first sub-tree and not included in the second sub-tree to the second sub-tree using a connection relationship identical to that within said first sub-tree; and deleting overlapping nodes included in the second sub-tree and in the first tree excluding the first sub-tree, except for nodes in a path from the sub-trunk node of the first tree to said trunk node via the real branches and nodes included in the second sub-tree.

11. The phase shifter arranging method as claimed in claim 4, wherein said tree is represented by A(i)=j using an array A(1) through A(m) consisting of m elements, where first through mth nodes form the nodes of the tree, an ith node is connected to a jth node in a hierarchical level one higher than that of said ith node via a real branch, 1 <i<m, and 1<j<m.

12. The phase shifter arranging method as claimed in claim 10, which further comprises the steps of:

selecting one node within said tree at random;

converting a sub-tree having the selected one node as a sub-trunk node into an array A(1) through A(m) which consists of m binary elements and indicate whether or not the phase shifters are to be arranged on aperture patterns corresponding to the nodes when a number of nodes in said sub-tree is less than or equal to a predetermined value, where said sub-tree is made up of first through mth nodes;

changing contents of said array A(1) through A(m) by regarding said array A(1) through A(m) as a one-dimensional chromosome and applying a genetic algorithm;

stopping the changing of the contents when a minimum value of the sum total of said sub-tree is not updated for a predetermined number of times in succession or a void branch no longer exists; and making a reverse conversion to convert the contents of said array A(1) through A(m) corresponding to said minimum value into said sub-tree so that the phase shifters are arranged on aperture patterns corresponding to the nodes in every other hierarchical level.

13. The phase shifter arranging method as claimed in claim 4, which further comprises the steps of:

obtaining a tree corresponding to the minimum value of said sum total with respect to all independent closed nets of said net;

after obtaining said tree, synthesizing trees of the open and closed nets into a single tree by connecting the trees of the open and closed nets so that connecting portions become identical to those prior to division of said net in said step (b); and arranging the phase shifters on aperture patterns corresponding to the nodes in every other hierarchical level of the synthesized single tree.

14. The phase shifter arranging method as claimed in claim 8, which further comprises the steps of:

defining a load which becomes larger as a value D becomes smaller and becomes smaller as a value L becomes larger, where D denotes an approximate interval between two adjacent aperture patterns corresponding to two nodes at both ends of the branch, and L denotes an approximate length along a contour of the aperture pattern having the approximate interval D with respect to the adjacent aperture pattern; and creating a tree as a chromosome in a first generation of the genetic algorithm, by calculating weights for all branches within the closed net, sorting the weights depending on size, and selecting the real branch with priority starting from a largest weight.

15. A computer readable medium having computer program logic recorded thereon for selectively arranging phase shifters on aperture patterns of a photomask so that a phase difference of πradians occurs between lights transmitted through mutually adjacent aperture patterns of the photomask, said computer readable medium comprising:

first means for extracting connections of nodes via branches as a net, where each aperture pattern is taken as a node, and mutually adjacent aperture patterns having an interval less than or equal to a predetermined value D0 are taken as nodes connected via a branch;

second means for dividing said net into an open net and a closed net which are independent of each other, said open net having no closed loop, said closed loop being other than said open loop; and third means for selectively arranging the phase shifters with respect to each of mutually independent closed nets.

16. The computer readable medium as claimed in claim 15, wherein said second means comprises:

means for moving between the nodes via the branch in said net to find a closed loop, and assigning a closed net number to each of the nodes forming said closed loop;

means for assigning the same closed net number to a node which is common to different closed nets; and means for taking a connection of the nodes assigned with the same closed net number via the branches as an independent closed net, and taking a connection of the nodes having no closed net number assigned thereto via the branches as an independent open net.

17. The computer readable medium as claimed in claim 15, wherein said third means comprises:

means for obtaining a connection of the nodes of said closed net via real branches as a tree, where said real branch is a single path through which a movement from a node other than a trunk node to said trunk node via the branch is possible; and means for arranging the phase shifters on aperture patterns corresponding to nodes in every other hierarchical level when said trunk node is in a first hierarchical level and a node in a (i+1)th hierarchical level is reached from said trunk node by passing through i real branches.

18. The computer readable medium as claimed in claim 17, wherein said third means further comprises:

means for modifying the tree;

means for obtaining, out of void branches other than the real branches of the tree, a void branch having or not having the phase shifters on both nodes at both ends thereof, as a contradictory branch; and means for obtaining a tree corresponding to a minimum value of a sum total of weighted contradictory branches.

19. The computer readable medium as claimed in claim 18, wherein weights of all of said weighted contradictory branches are 1.

20. The computer readable medium as claimed in claim 18, wherein a weight of the weighted contradictory branch becomes larger as a value D becomes smaller and becomes smaller as a value L becomes larger, where said value D is approximately an interval between two aperture patterns corresponding to both ends of said weighted contradictory branch.

21. The computer readable medium as claimed in claim 18, which further comprises:

fourth means for modifying said tree using random numbers; and fifth means for stopping modification of said tree when said minimum value of the sum total is not updated for a predetermined number of times in succession or said void branch no longer exists.

22. The computer readable medium as claimed in claim 21, wherein said fourth means modifies one or more trees based on a genetic algorithm.

23. The computer readable medium as claimed in claim 22, wherein said genetic algorithm includes a mutation, and said mutation comprises the steps of:

selecting one tree based on a probability which depends on said sum total;

selecting one void branch at random and changing said one void branch into a real branch with respect to the selected one tree; and changing a real branch connecting a first node at one end of the selected one void branch and a second node in a hierarchical level which is one level higher than that of said first node into a void branch.

24. The computer readable medium as claimed in claim 22, wherein said genetic algorithm includes a crossover, said crossover comprising the steps of:

selecting first and second trees of the same closed net at random based on a probability which depends on said sum total;

selecting one of the nodes at random from each of said first and second trees;

replacing a first sub-tree having the selected one node from the first tree as a sub-trunk node by a second sub-tree having the selected one node from the second tree as a sub-trunk node;

adding nodes included in the first sub-tree and not included in the second sub-tree to the second sub-tree using a connection relationship identical to that within said first sub-tree; and deleting overlapping nodes included in the second sub-tree and in the first tree excluding the first sub-tree, except for nodes in a path from the sub-trunk node of the first tree to said trunk node via the real branches and nodes included in the second sub-tree.

25. The computer readable medium as claimed in claim 18, wherein said tree is represented by $A(i) = j$ using an array $A(1)$ through $A(m)$ consisting of m elements, where first through mth nodes form the nodes of the tree, an ith node is connected to a jth node in a hierarchical level one higher than that of said ith node via a real branch, $1 < i < m$, and $1 < j < m$.

26. The computer readable medium as claimed in claim 24, which further comprises:

means for selecting one node within said tree at random;

means for converting a sub-tree having the selected one node as a sub-trunk node into an array $A(1)$ through $A(m)$ which consists of m binary elements and indicate whether or not the phase shifters are to be arranged on aperture patterns corresponding to the nodes when a number of nodes in said sub-tree is less than or equal to a predetermined value, where said sub-tree is made up of first through mth nodes;

means for changing contents of said array $A(1)$ through $A(m)$ by regarding said array $A(1)$ through $A(m)$ as a one-dimensional chromosome and applying a genetic algorithm;

stopping the changing of the contents when a minimum value of the sum total of said sub-tree is not updated for a predetermined number of times in succession or a void branch no longer exists; and means for making a reverse conversion to convert the contents of said array $A(1)$ through $A(m)$ corresponding to said minimum value into said sub-tree so that the phase shifters are arranged on aperture patterns corresponding to the nodes in every other hierarchical level.

27. The computer readable medium as claimed in claim 18, which further comprises:

means for obtaining a tree corresponding to the minimum value of said sum total with respect to all independent closed nets of said net;

means for, after obtaining said tree, synthesizing trees of the open and closed nets into a single tree by connecting the trees of the open and closed nets so that connecting portions become identical to those prior to division of said net by said second means; and means for arranging the phase shifters on aperture patterns corresponding to the nodes in every other hierarchical level of the synthesized single tree.

28. The computer readable medium as claimed in claim 22, which further comprises:

means for defining a load which becomes larger as a value D becomes smaller and becomes smaller as a value L becomes larger, where D denotes an approximate interval between two adjacent aperture patterns corresponding to two nodes at both ends of the branch, and L denotes an approximate length along a contour of the aperture pattern having the approximate interval D with respect to the adjacent aperture pattern; and means for creating a tree as a chromosome in a first generation of the genetic algorithm, by calculating weights for all branches within the closed net, sorting the weights depending on size, and selecting the real branch with priority starting from a largest weight.

* * * * *